(12) United States Patent
Miyakoshi et al.

(10) Patent No.: US 6,634,736 B2
(45) Date of Patent: Oct. 21, 2003

(54) INK-JET RECORDING HEAD, CIRCUIT BOARD FOR INK-JET RECORDING HEAD, INK-JET RECORDING HEAD CARTRIDGE, AND INK-JET RECORDING APPARATUS

(75) Inventors: Toshimori Miyakoshi, Tokyo (JP); Hirokazu Komuro, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 09/900,030

(22) Filed: Jul. 9, 2001

(65) Prior Publication Data
US 2002/0003557 A1 Jan. 10, 2002

(30) Foreign Application Priority Data
Jul. 10, 2000 (JP) ........................................ 2000-209102

(51) Int. Cl.$^7$ ................................................. B41J 2/05
(52) U.S. Cl. ........................................... 347/57; 347/58
(58) Field of Search ............................... 347/56–59, 63, 347/65, 61, 67

(56) References Cited

U.S. PATENT DOCUMENTS 5,121,143 A  *  6/1992  Hayamizu ..................... 347/58

FOREIGN PATENT DOCUMENTS

| EP | 0613781 A1 | * | 2/1994 | ............ B41J/2/205 |
| JP | 10-44416 |   | 2/1998 | .............. B41J/2/05 |

* cited by examiner

Primary Examiner—Juanita Stephens
(74) Attorney, Agent, or Firm—Fitzpatrick, Cella, Harper & Scinto

(57) ABSTRACT

A circuit board for an ink-jet recording head which ejects ink includes a plurality of electrothermal transducers for generating thermal energy which is used for ejecting ink; and a plurality of wiring electrodes for supplying electric power to the plurality of electrothermal transducers, the plurality of wiring electrodes each having a thickness of one of at least two values according to the length of each wiring electrode, whereby the resistance of the wiring electrodes are made uniform between each wiring electrode without significantly increasing the width of the wiring electrodes.

44 Claims, 23 Drawing Sheets

INK-JET RECORDING HEAD, CIRCUIT BOARD FOR INK-JET RECORDING HEAD, INK-JET RECORDING HEAD CARTRIDGE, AND INK-JET RECORDING APPARATUS

BACKGROUND OF THE INVENTION

1. Field of the Invention

The present invention relates to ink-jet recording heads and ink-jet recording apparatuses using the same. In particular, the present invention relates to an ink-jet recording head, a circuit board for an ink-jet recording head, an ink-jet recording head cartridge, and an ink-jet recording apparatus in which bubbles are produced in ink by using thermal energy generated by heat-generating resistors and the ink for recording is ejected by expansion and contraction of the bubbles and in which the resistance of wiring electrodes for supplying electric power to the heat-generating resistors is made uniform between each wiring electrode.

2. Description of the Related Art

Various ink-jet recording heads are known, in which ink droplets to be ejected are formed in different ways. Conventional recording apparatuses use these recording heads which perform recording in such a manner that the ejected ink droplets adhere to recording media such as sheets of paper. In particular, the ink-jet recording heads which use heat as an energy for producing the ink droplets to be ejected can be provided relatively easily with multiple ink ejection ports disposed in high density, whereby high speed, high resolution, and high quality recording is made possible.

A so-called side-shooter-type ink-jet recording head is known as a recording head which ejects ink by using thermal energy. In the side-shooter-type ink-jet recording head, ink droplets are upwardly ejected substantially in perpendicular to a plane along which heat-generating resistors for generating thermal energy are disposed. In the recording head of this type, the ink is generally supplied through an ink supply opening which is formed passing through a circuit board provided with the heat-generating resistors, the ink being supplied from the rear side of the circuit board.

FIGS. 22 and 23 show the known side-shooter-type inkjet recording head. FIG. 22 is a perspective view of a part of the circuit board, which is exposed by cutting away a part of a member which defines ink ejection ports. FIG. 23 mainly shows wiring electrodes in plan provided on the circuit board of the recording head.

In the side-shooter-type ink-jet recording head shown in FIG. 22, a plurality of electrothermal transducers (hereinafter referred to as heaters) 802 disposed on a circuit board 805 and in a staggered way at sides of an ink supply opening 803 which is formed passing through the circuit board 805. The circuit board 805 is provided with a member formed thereon, which defines ink ejection ports 801 opposing the respective electrothermal transducers 802 and associating with ink flow paths 804.

The circuit board 805 shown in FIG. 23 is provided thereon with source-side common wiring electrodes 902a and 902b for selectively driving the plurality of heaters 802 to eject ink in accordance with recording data, heat-generating resistors forming the electrothermal transducers 802 and wiring electrodes for supplying electric power thereto, driving devices such as transistors (shown in black in the drawing and formed at a lower layer side), and ground-side common wiring electrodes 904a and 904b. These wiring electrodes and circuits are connected in series to each other. Each source-side or ground-side common wiring electrode 902a or 902b, or 904a or 904b can be electrically connected to the outside of the circuit board 805 through electrode pads 903. Inter-layer insulative films, protective films, and the like are omitted from these drawings.

In the ink-jet recording head thus formed, ink is held so as to form a meniscus in the vicinity of each ink ejection port 801. The ink is quickly boiled at heated surfaces by using thermal energy produced by the heaters 802 selectively driven in accordance with recording data, whereby the ink is ejected by pressure of bubbles generated when the ink is boiled.

Electric energy or power to be applied to a heater for ejecting ink is an important factor which affects the quality of ink ejection. That is, when the electric energy varies, the state of ink-bubble development varies, whereby there is a risk that the ink is not ejected as designed. For example, when the electric energy, that is, driving energy is not sufficiently applied, there is a risk that film boiling of the ink is unstably performed, whereby the speed, direction, and amount of ejection of the ink droplets may vary, thereby deteriorating the quality of recorded images and producing kinks, shabbiness, scratchiness, etc. When the driving energy is excessively applied, a mechanical stress is given to the electrothermal transducers and film boiling of the ink is unstably performed, whereby the quality of ejection of the ink droplets is deteriorated, as described above, and the recording head may be damaged in the worst case.

Therefore, energy having the same value is preferably inputted into each of the plurality of heaters and the amount of the energy to be inputted into each heater is preferably constant.

It is known that the amount of energy inputted to each heater varies when the number of heaters of a head driven at the same time varies. That is, the voltage-drop value varies according to the number of heaters driven at the same time which varies according to the recording data and the like, thereby changing the driving energy inputted to each heater.

A configuration as a countermeasure to this problem is devised in that, as shown in FIG. 23, wiring electrodes between the heaters 802 and the electrode pads 903 and between the driving devices and the electrode pads 903 are divided into a plurality of wiring electrodes, and a resistance value in each wiring electrode 902a, 902b, 904a, or 904b is substantially the same, for example, as disclosed in Japanese Patent Laid-Open No. 10-44416. With this arrangement, the difference in voltage drop at each common wiring electrode between a case in which all the heaters are driven and the case in which a single heater is driven can be reduced, whereby the same amount of driving energy can be applied to each heater.

In the above known configuration, the voltage drop produced when driving the heaters due to the common wiring electrodes is reduced. The resistance of wiring is reduced by increasing the width of each common wiring electrode 902a, 902b, 904a, or 904b, and the resistance of the wiring electrodes 902a, 902b, 904a, and 904b is made uniform by differing the widths of the common wiring electrodes 902a, 902b, 904a, and 904b from each other according to the lengths of the common wiring electrodes 902a, 902b, 904a, and 904b, respectively, as widths A and B shown in FIG. 23 differ from each other.

Recently, ink-jet recording apparatuses generally use recording heads each provided with a plurality of heaters highly densely integrated with each other so as to obtain high-resolution and high-quality images at high speeds. On the other hand, the recording heads are required to be reduced in size. Therefore, it is very difficult to uniform resistance values of wiring electrodes from electrode pads to heaters only by controlling the width of each wiring electrode under the condition in which the size of the recording head cannot be increased.

Since the size of a circuit board is increased when intending to uniform the resistance of wiring electrodes only by controlling the width of each wiring electrode, manufacturing costs are increased because the number of substrates obtained from one silicon wafer is reduced, and the size of the recording head is increased due to the increased size of the substrate. When a plurality of heaters are driven according to divided time-sharing groups, variations in the amount of driving energy to be applied may be reduced by increasing the number of divisions in timesharing groups, thereby reducing the number of heaters which are simultaneously driven. However, the recording head is generally driven at a high frequency due to the requirement for high-speed recording, and driven periods are made shorter when increasing the number of divisions in timesharing groups. Therefore, it is difficult to further reduce the width of a driving pulse by increasing the number of divisions in time-sharing groups in consideration of the responsiveness of the driving devices. Although the reduction corresponding to the voltage drop of the applied driving energy may be compensated for by pulse-width modulation, it is necessary to have a logical circuit for controlling the driving energy to be constant, and the manufacturing costs may thereby increase.

SUMMARY OF THE INVENTION

Accordingly, it is an object of the present invention to provide an ink-jet recording head, a circuit board for an ink-jet recording head, an ink-jet recording head cartridge, and an ink-jet recording apparatus in which the resistance of wiring electrodes are made substantially the same between each wiring electrode without increasing the size of the ink-jet recording head.

To the end, according to a first aspect of the present invention, a circuit board for an ink-jet recording head which ejects ink comprises a plurality of electrothermal transducers for generating thermal energy which is used for ejecting ink; and a plurality of wiring electrodes for supplying electric power to the plurality of electrothermal transducers, the plurality of wiring electrodes each having a thickness of one of at least two values.

According to a second aspect of the present invention, a circuit board for an ink-jet recording head which ejects ink comprises a plurality of electrothermal transducers for generating thermal energy which is used for ejecting ink; and a plurality of wiring electrodes for supplying electric power to the plurality of electrothermal transducers, the plurality of wiring electrodes each having a plurality of layers which are successively formed by using wiring-electrode-forming patterns. The thickness of each of the plurality of wiring electrodes differs from that of the other wiring electrodes by differing each of the wiring-electrode-forming patterns from the others.

According to a third aspect of the present invention, a circuit board for an ink-jet recording head which ejects ink comprises a plurality of electrothermal transducers for generating thermal energy which is used for ejecting ink; and a wiring unit for applying electric power supplied from the outside to the plurality of electrothermal transducers, the wiring unit being divided into a plurality of wires each formed with a plurality of layers and provided with an electrode pad for receiving the electric power. The resistance of the plurality of wires between the electrode pads and the electrothermal transducers is substantially the same for each wire.

According to a fourth aspect of the present invention, an ink-jet recording head for ejecting ink comprises a circuit board which comprises a plurality of electrothermal transducers for generating thermal energy which is used for ejecting ink; and a plurality of wiring electrodes for supplying electric power to the plurality of electrothermal transducers, the plurality of wiring electrodes each having a thickness of one of at least two values.

According to fifth aspect of the present invention, an ink-jet recording head for ejecting ink comprises a circuit board which comprises a plurality of electrothermal transducers for generating thermal energy which is used for ejecting ink; and a plurality of wiring electrodes for supplying electric power to the plurality of electrothermal transducers, the plurality of wiring electrodes each having a plurality of layers which are successively formed by using wiring-electrode-forming patterns. The thickness of each of the plurality of wiring electrodes differs from that of the other wiring electrodes by differing each of the wiring-electrode-forming patterns from the others.

According to a sixth aspect of the present invention, an ink-jet recording head for ejecting ink comprises a circuit board which comprises a plurality of electrothermal transducers for generating thermal energy which is used for ejecting ink; and a wiring unit for applying electric power supplied from the outside to the plurality of electrothermal transducers, the wiring unit being divided into a plurality of wires each formed with a plurality of layers and provided with an electrode pad for receiving the electric power. The resistance of the plurality of wires between the electrode pads and the electrothermal transducers is substantially the same for each wire.

According to seventh aspect of the present invention, an ink-jet recording head cartridge comprises an ink-jet recording head for ejecting ink, which comprises a circuit board, and an ink tank for receiving ink to be supplied to the ink-jet recording head. The circuit board comprises a plurality of electrothermal transducers for generating thermal energy which is used for ejecting ink; and a plurality of wiring electrodes for supplying electric power to the plurality of electrothermal transducers, the plurality of wiring electrodes each having a thickness of one of at least two values.

According to an eighth aspect of the present invention, an ink-jet recording head cartridge comprises an ink-jet recording head for ejecting ink, which comprises a circuit board, and an ink tank for receiving ink to be supplied to the ink-jet recording head. The circuit board comprises a plurality of electrothermal transducers for generating thermal energy which is used for ejecting ink; and a plurality of wiring electrodes for supplying electric power to the plurality of electrothermal transducers, the plurality of wiring electrodes each having a plurality of layers which are successively formed by using wiring-electrode-forming patterns. The thickness of each of the plurality of wiring electrodes differs from that of the other wiring electrodes by differing each of the wiring-electrode-forming patterns from the others.

According to a ninth aspect of the present invention, an ink-jet recording head cartridge comprises an ink-jet recording head for ejecting ink, which comprises a circuit board, and an ink tank for receiving ink to be supplied to the ink-jet recording head. The circuit board comprises a plurality of electrothermal transducers for generating thermal energy which is used for ejecting ink; and a wiring unit for applying electric power supplied from the outside to the plurality of electrothermal transducers, the wiring unit being divided into a plurality of wires each formed with a plurality of layers and provided with an electrode pad for receiving the electric power. The resistance of the plurality of wires between the electrode pads and the electrothermal transducers is substantially the same for each wire.

According to a tenth aspect of the present invention, an ink-jet recording apparatus comprises an ink-jet recording head for ejecting ink which comprises a circuit board. The circuit board comprises a plurality of electrothermal transducers for generating thermal energy which is used for ejecting ink; and a plurality of wiring electrodes for supplying electric power to the plurality of electrothermal transducers, the plurality of wiring electrodes each having a thickness of one of at least two values.

According to an eleventh aspect of the present invention, an ink-jet recording apparatus comprises an inkjet recording head for ejecting ink which comprises a circuit board. The circuit board comprises a plurality of electrothermal transducers for generating thermal energy which is used for ejecting ink; and a plurality of wiring electrodes for supplying electric power to the plurality of electrothermal transducers, the plurality of wiring electrodes each having a plurality of layers which are successively formed by using wiring-electrode-forming patterns. The thickness of each of the plurality of wiring electrodes differs from that of the other wiring electrodes by differing each of the wiring-electrode-forming patterns from the others.

According to a twelfth aspect of the present invention, an ink-jet recording apparatus comprises an ink-jet recording head for ejecting ink which comprises a circuit board. The circuit board comprises a plurality of electrothermal transducers for generating thermal energy which is used for ejecting ink; and a wiring unit for applying electric power supplied from the outside to the plurality of electrothermal transducers, the wiring unit being divided into a plurality of wires each formed with a plurality of layers and provided with an electrode pad for receiving the electric power. The resistance of the plurality of wires between the electrode pads and the electrothermal transducers is substantially the same for each wire.

Since at least one of the plurality of wiring electrodes, according to the present invention, has a thickness of one of at least two values, the resistance of the plurality of wiring electrodes can be controlled so as to be the same for each wiring electrode by differing the thickness of each wiring electrode from that of the other wiring electrodes. With this arrangement, the area of a circuit board for wiring electrodes can be reduced compared with a case in which the resistance of wiring electrodes is controlled only by varying the width of each wiring electrode.

According to the present invention, an ink-jet recording head is obtainable without increasing the size of a circuit board of the ink-jet recording head, in which the resistance of wiring electrodes provided on the circuit board is uniform and the variations in driving energy inputted to each heater are thereby reduced.

Further objects, features and advantages of the present invention will become apparent from the following description of the preferred embodiments with reference to the attached drawings.

DESCRIPTION OF THE PREFERRED EMBODIMENTS

Embodiments according to the present invention are described below in detail with reference to the drawings.

A printer as an ink-jet recording apparatus according to a first embodiment of the present invention is described below with reference to FIGS. 1 to 10 before describing embodiments of an ink-jet recording head according to the present invention.

In the present specification, the term "recording" or "printing" refers not only to forming meaningful information such as characters and figures. The term widely refers to forming images, figures, patterns, and the like on media or processing the media regardless of whether or not the images, figures, patterns, and the like are meaningful or whether or not the images, figures, patterns, and the like are visible.

In the present specification, the term "recording medium" or "printing medium" refers not only to a sheet of paper which is generally used in a printing apparatus. The term widely refers to a subject, which can receive ink, such as a piece of cloth, a plastic film, a metallic plate, glass, a ceramic, a piece of wood, and a sheet of leather.

In the present specification, the term "ink" (hereinafter sometimes referred to as "liquid") widely refers to a liquid which serves to form images, figures, patterns, and the like, to process the printing medium, or to process the ink (for example, solidification or insolubilization of color materials included in the ink applied to the printing medium) by being applied on the printing medium.

(Printer Body)

Figure 1:
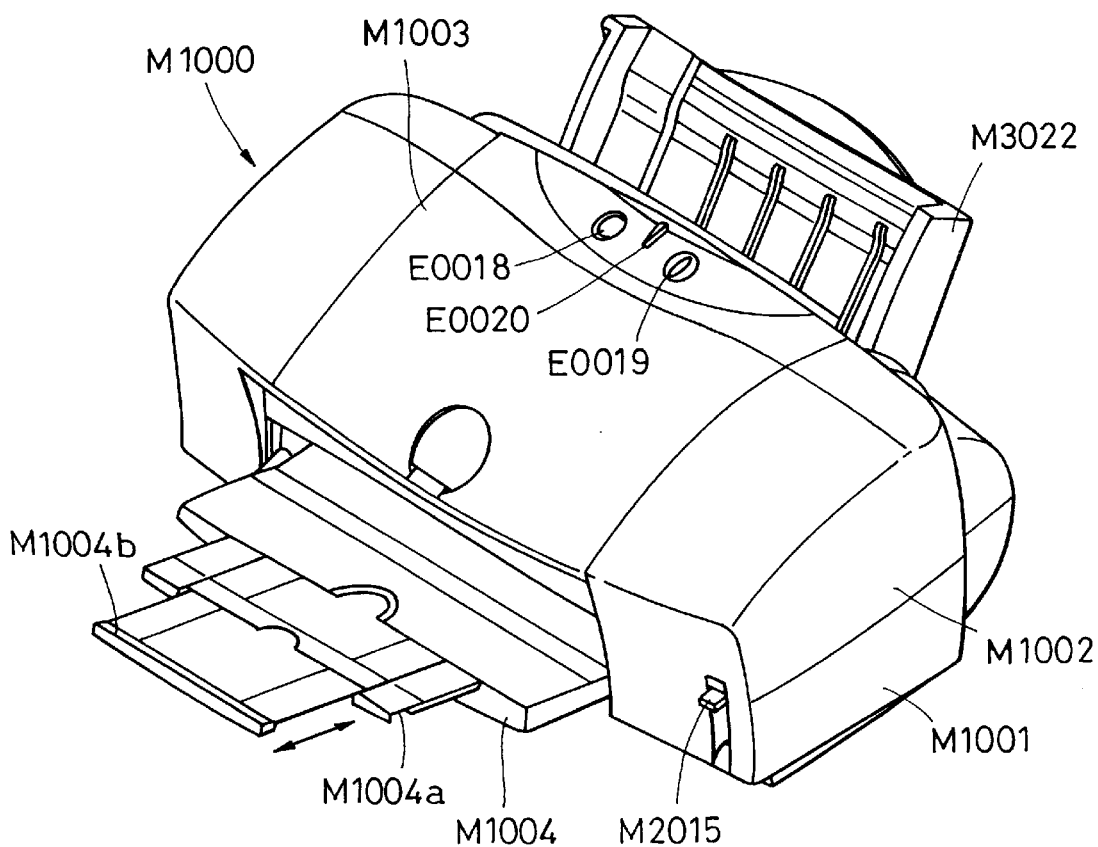
FIG. 1 is a perspective view of an ink-jet printer according to a first embodiment of the present invention.
Figure 2:
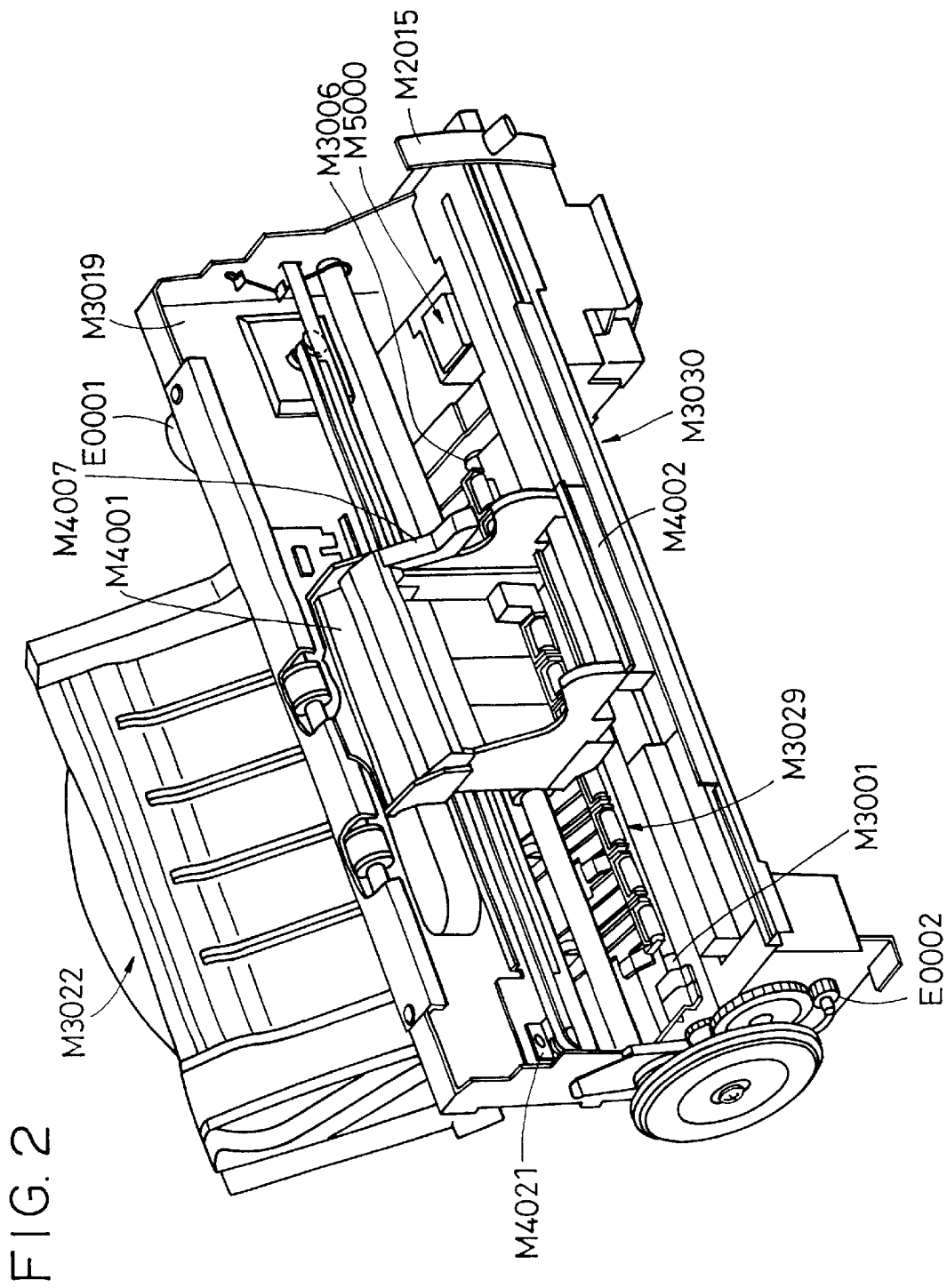
FIG. 2 is a perspective view of the ink-jet printer shown in FIG. 1 of which a casing member is removed.

FIGS. 1 and 2 are perspective views of an ink-jet-recording-type printer. In FIG. 1, a casing member of a printer body M1000 is formed with an exterior package including a lower case M1001, an upper case M1002, an access cover M1003, and a discharge tray M1004, and a chassis M3019 (see FIG. 2) which is received in the exterior package.

The chassis M3019 is formed with a plurality of metallic plates having a predetermined strength in a shape of a recording apparatus for holding movement units for recording which are described below.

The lower case M1001 forms substantially lower part of the exterior package of the printer body M1000, and the upper case M1002 forms substantially upper part of the exterior package of the printer body M1000. The lower and upper cases M1001 and M1002 coupled with each other form a hollow structure which defines a space for receiving therein the movement units for recording to be described below. The printer body M1000 is provided with openings in an upper face and a front face, respectively, of the printer body M1000.

The discharge tray M1004 is pivotably supported at an end thereof by the lower case M1001. The opening formed in the front face of the lower case M1001 of the printer body M1000 opens and closes by pivoting the discharge tray M1004. When performing recording, the discharge tray M1004 is pivoted toward the front so as to expose the opening through which recorded sheets P are discharged, and the recorded sheets P are successively stacked on the discharge tray M1004. The discharge tray M1004 includes sub-trays M1004a and M1004b which can be individually extended from and withdrawn into the discharge tray M1004, as needed, whereby the area of the tray for stacking the recorded sheets P can vary in three stages.

The access cover M1003 is pivotably supported at an end thereof by the upper case M1002. The opening formed in the upper face of the printer body M1000 opens and closes by pivoting the access cover M1003. By pivoting and removing the access cover M1003, an ink-jet recording head cartridge H1000, ink tanks H1900, and the like which are received in the printer body M1000 can be replaced. When pivoting the access cover M1003, the access cover M1003 pivots a cover-pivoting lever at a protrusion formed at the rear face of the access cover M1003 (not shown). The position of the access cover M1003 can be determined by determining the position of the cover-pivoting lever by a microswitch or the like.

A power-source key E0018 and a resume key E0019 are depressibly provided at a rear part of the upper face of the upper case M1002. A light-emitting diode (LED) E0020 is also provided at the rear part of the upper face of the upper case M1002. When depressing the power-source key E0018, the LED E0020 is lighted, thereby indicating that the apparatus is prepared for recording. The LED E0020 can be provided with various indication functions by varying the way of illumination, such as flickering, varying the light color, and the like, for indicating, for example, troubles of the printer. When the troubles are resolved, the printer returns into the recording mode by depressing the resume key E0019.

(Movement Units for Recording)

The movement units for recording are described below, the movement units being received and held by the printer body M1000 of the ink-jet apparatus according to the first embodiment.

The movement units for recording, according to the first embodiment, include an automatic sheet-feeder M3022 for automatically feeding the recording sheets P to the printer body M1000, a sheet transfer device M3029 for transferring the recording sheets P, which have been fed one by one by the automatic sheet-feeder M3022, to a recording position and to a discharge device M3030, a recording device for recording on the recording sheets P transferred to the recording position, and a recovery device M5000 for recovering the recording device and the like.

(Recording Device)

The recording device includes a carriage M4001 movably supported by a carriage axle M4021, and the ink-jet recording head cartridge H1000 detachably mounted on the carriage M4001.

(Recording Head Cartridge)

The ink-jet recording head cartridge H1000 to be used in the recording device is described with reference to FIGS. 3 to 5.

Figure 3:
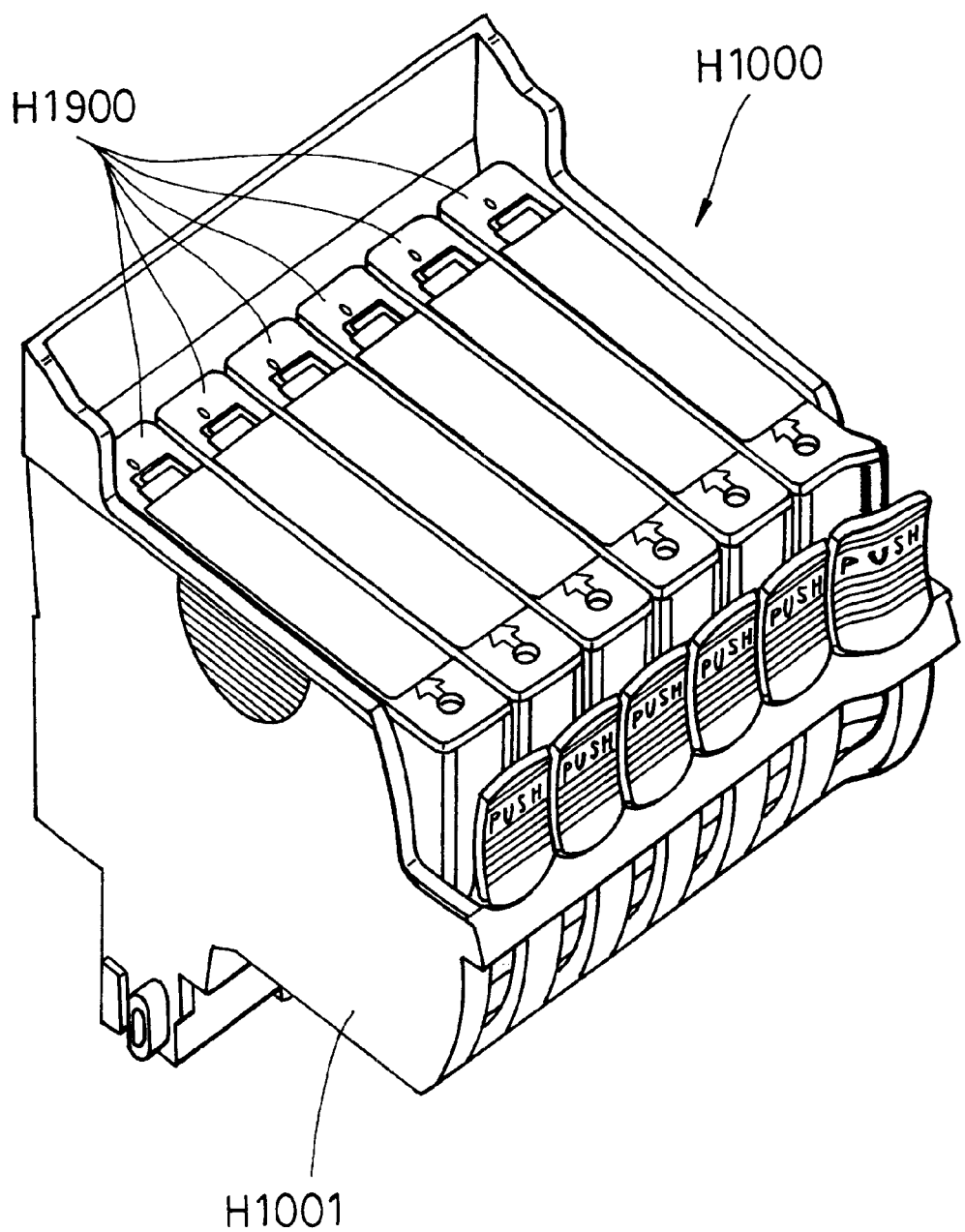
FIG. 3 is a perspective view of an ink-jet recording head including a head cartridge mounted therein, which is used in the ink-jet printer according to the first embodiment of the present invention.
Figure 4:
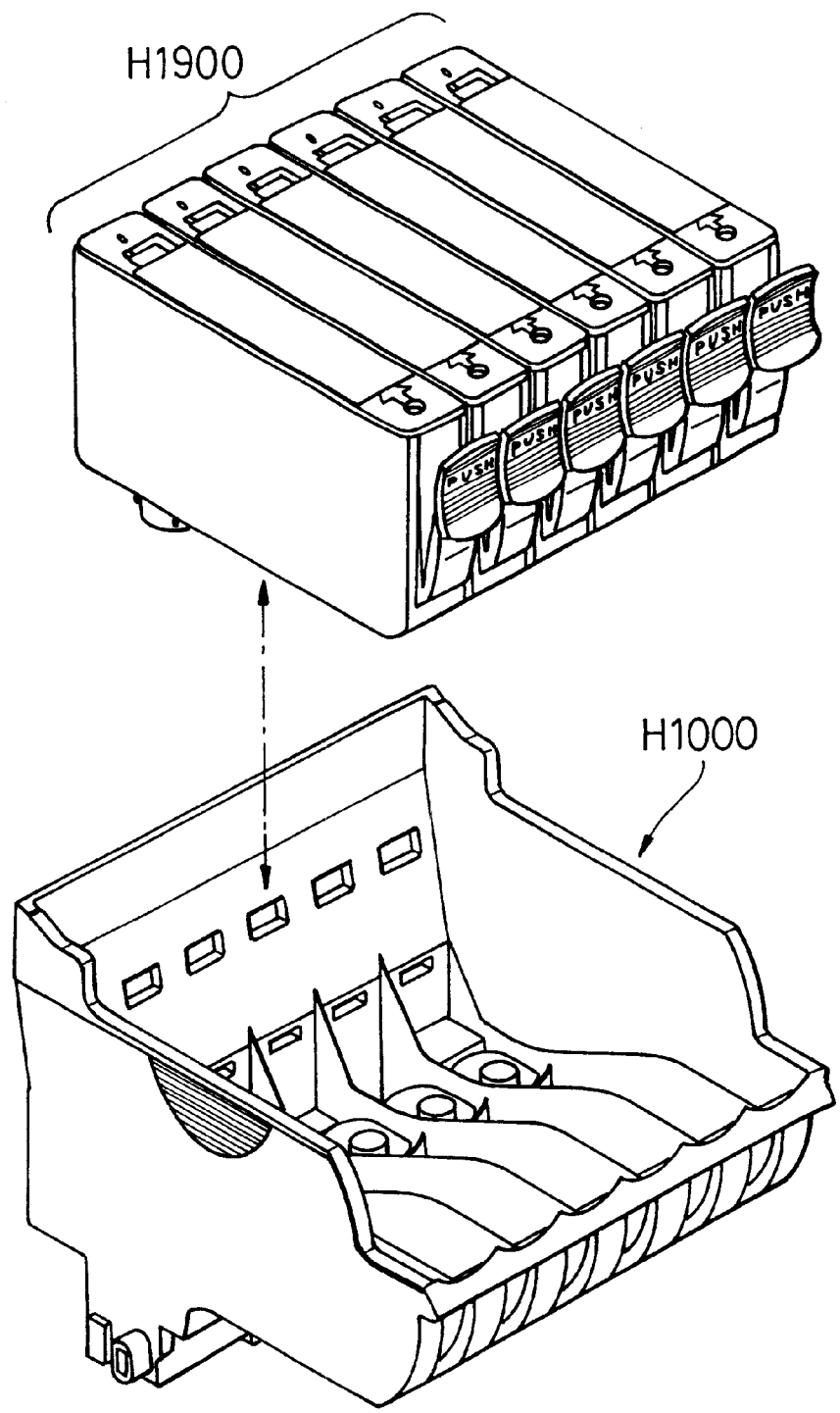
FIG. 4 is an exploded perspective view of the ink-jet recording head shown in FIG. 3.

In FIG. 3, the ink-jet recording head cartridge H1000 according to the first embodiment includes the ink tanks H1900 for storing ink and an ink-jet recording head H1001 for ejecting the ink supplied from the ink tanks H1900 in accordance with recording data. The ink-jet recording head H1001 is a cartridge-type head which is detachably mounted to the carriage M4001 which is described below.

According to the first embodiment, the ink-jet recording head cartridge H1000 is provided with the ink tanks H1900, each for black, light cyan, light magenta, cyan, magenta, or yellow, for photograph-like high-quality color printing. The ink tanks H1900 are mounted individually detachable on the ink-jet recording head H1001, as shown in FIG. 4.

Figure 5:
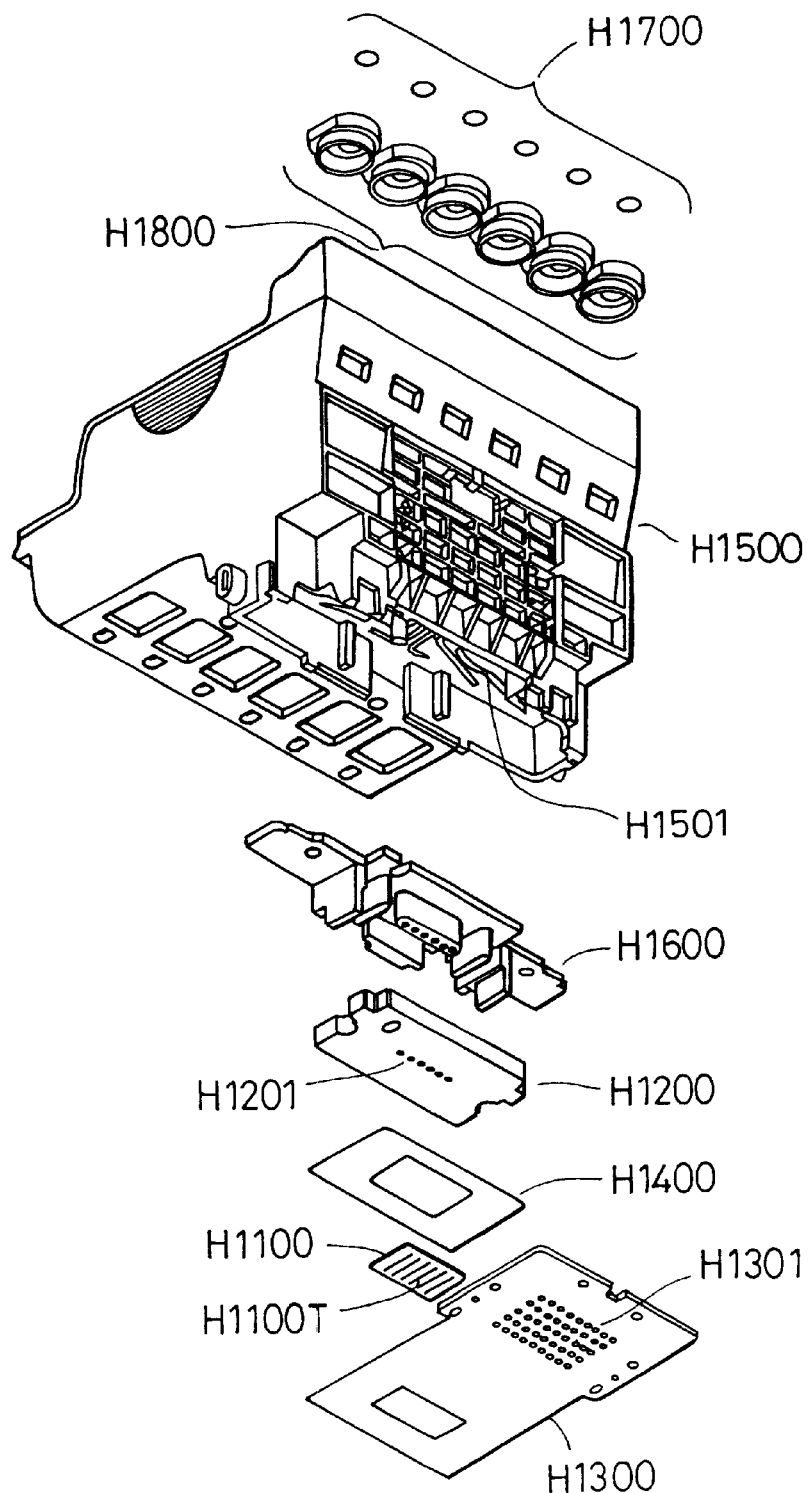
FIG. 5 is an exploded perspective view of the ink-jet recording head shown in FIG. 4 in an oblique fashion from the bottom of the ink-jet recording head.

In an exploded perspective view shown in FIG. 5, the ink-tank recording head H1001 includes a recording element board H1100, a first plate H1200, an electric circuit board H1300, a second plate H1400, a tank holder H1500, a flow-path forming member H1600, filters H1700, and elastic seals H1800.

The recording element board H1100 is provided with a plurality of recording elements for ejecting ink and electrical wires of aluminum or the like for supplying an electric power to the recording elements, the recording elements and the electrical wires being formed on a surface of a silicon substrate of the recording element board H1100 by film deposition. A plurality of ink-flow paths and ejection ports H1100T associating with the recording elements are formed by photolithography. A plurality of ink-supply openings for supplying ink to the ink-flow paths are formed so as to open in the rear surface of the recording element board H1100. The recording element board H1100 is bonded to the first plate H1200, and the first plate H1200 is provided with ink-supply openings H1201 formed therein for supplying ink to the recording element board H1100. The second plate H1400 having an opening is bonded to the first plate H1200. The electric circuit board H1300 is electrically connected to the recording element board H1100 via the second plate H1400. The electric circuit board H1300 applies electric signals to the recording element board H1100 to eject ink. The electric circuit board H1300 is provided with an electric circuit associating with the recording element board H1100 and external signal input terminals H1301 at ends of the electric circuit for receiving electrical signals from the printer body M1000. The external signal input terminals H1301 are positioned at and fixed to the rear face of the tank holder H1500.

The flow-path forming member H1600 is fixed by, for example, ultrasonic welding to the tank holder H1500 which detachably holds the ink tanks H1900, and forms ink-flow paths H1501 from the respective ink tanks H1900 to the first plate H1200. The ink-flow paths H1501 mating with the ink tanks H1900 are individually provided with the filters H1700 at the ends of the ink-flow paths H1501 connecting with the ink tanks H1900, thereby avoiding penetration of dusts from the outside. The elastic seals H1800 are mounted at connected parts between the ink tanks H1900 and the ink-flow paths H1501, thereby preventing the ink from evaporating through the connected parts.

The ink-jet recording head H1001 is formed by connecting by bonding or the like a recording element unit including the recording element board H1100, the first plate H1200, the electric circuit board H1300, and the second plate H1400 to a tank holder unit including the tank holder H1500, the flow-path forming member H1600, the filters H1700, and the elastic seals H1800.

(Carriage)

The carriage M4001 for mounting the ink-jet recording head cartridge H1000 is described below with reference to FIG. 2.

In FIG. 2, the carriage M4001 is provided with a carriage cover M4002 which couples with the carriage M4001 and guides the ink-jet recording head H1001 to a given mounting position on the carriage M4001 and a head-setting lever M4007 which couples with the tank holder H1500 of the ink-jet recording head H1001 and presses the ink-jet recording head H1001 so as to set the same to the given mounting position.

The head-setting lever M4007 is pivotably mounted on a head-setting-lever shaft at an upper part of the carriage M4001. The head-setting lever M4007 is provided with a resiliently urged head-setting plate (not shown) at a mating part between the carriage M4001 and the ink-jet recording head H1001, and mounts the ink-jet recording head H1001 to the carriage M4001 by pressing the ink-jet recording head H1001 by a resilient force.

A contact flexible print cable (hereinafter referred to as "contact FPC" (see FIG. 7)) E0011 is provided at another mating part between the carriage M4001 and the ink-jet recording head H1001. A contact part of the contact FPC E0011 and a contact part H1301 (the external signal input terminals) are electrically connected to each other so as to perform transfer of various data for recording and supply of electric power to the ink-jet recording head H1001.

A resilient member such as rubber (not shown) is provided between the contact part of the contact FPC E0011 and the carriage M4001. The contact part of the contact FRC E1100 and the carriage M4001 are reliably brought into contact to each other by resiliency of the resilient member and the pressing force of a resilient part of the head-setting lever M4007. The contact FPC E0011 is connected to a carriage printed circuit board (CRPCB) E0013 (see FIG. 7).

(Scanner)

The printer according to the first embodiment can be used as a read device by being mounted with a scanner on the carriage M4001 in place of the above ink-jet recording head cartridge H1000.

The scanner moves together with the carriage M4001 of the printer side in a primary scanning direction, and reads from an original image fed in place of a recording medium while moving in the primary scanning direction. Reading operations in the primary scanning direction and feeding operations of the original image in a secondary scanning operations are alternately performed, thereby reading from the overall original image.

Figure 6A:
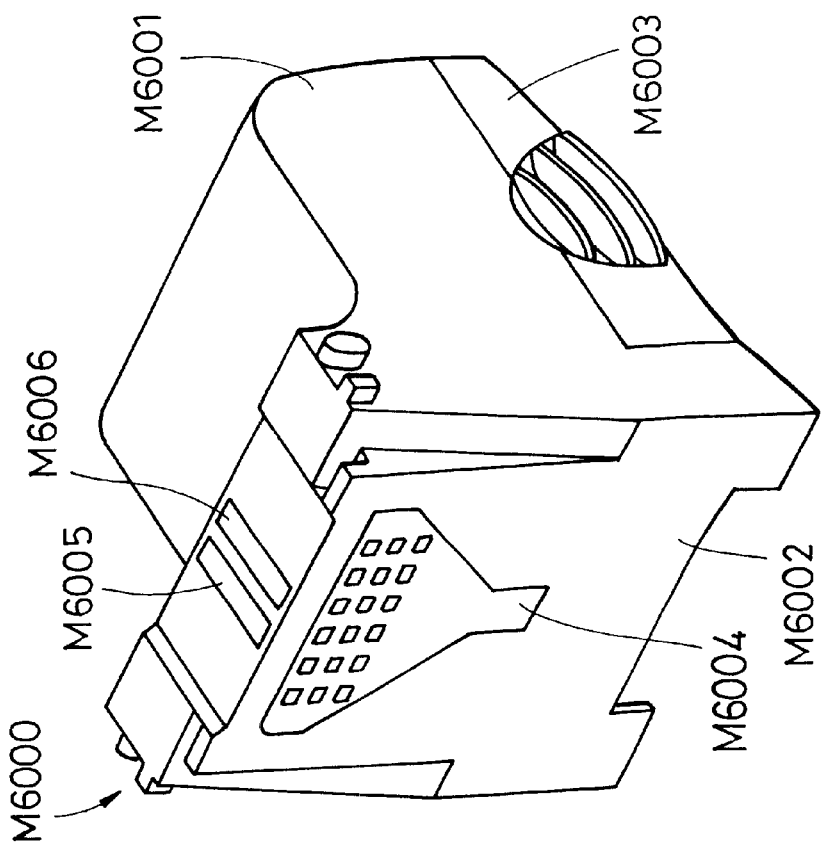
FIGS. 6A and 6B are perspective views of a scanner cartridge substituting for the ink-jet recording head cartridge shown in FIG. 3, which can be mounted to the inkjet printer according to the first embodiment of the present invention, the scanner cartridge being shown vertically inversely between FIGS. 6A and 6B.
Figure 6B:
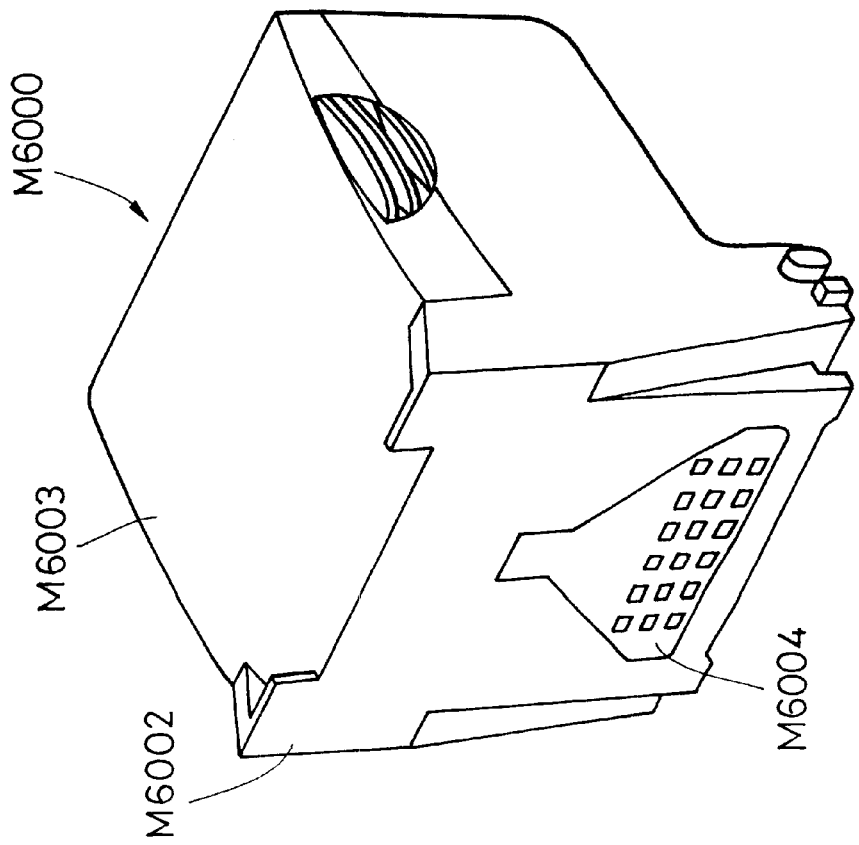

FIGS. 6A and 6B are perspective views of a scanner M6000 which is shown vertically inversely between FIGS. 6A and 6B for clear description.

In FIGS. 6A and 6B, a substantially box-shaped scanner holder M6001 receives therein optical components, processing circuits, and the like necessary for reading. The scanner M6000 is provided with a read lens M6006 at a position opposing an original image when the scanner M6000 is mounted on the carriage M4001. The scanner M6000 reads from the original image by converging reflecting light fluxes from the original image on a reading unit disposed in the scanner M6000. The light from a light source (not shown) is applied to the original image through an illuminator lens M6005.

A scanner cover M6003 is coupled with the scanner holder M6001 at the bottom of the scanner holder M6001 so as to block the light to the inside of the scanner holder M6001. The scanner holder M6001 can be easily mounted to and removed from the carriage M4001 by holding looper-shaped grips provided at the lateral sides of the scanner holder M6001. The scanner holder M6001 has substantially the same shape as that of the ink-jet recording head H1001. The scanner M6000 is mounted to and removed from the carriage M4001 in the same manner as the ink-jet recording head cartridge H1000.

The scanner holder M6001 receives a read-processing circuit board and a scanner contact PCB M6004 which is connected to the read-processing circuit board and is exposed to the outside. When the scanner M6000 is mounted on the carriage M4001, the scanner contact PCB M6004 comes into contact to the contact FPC E0011 of the carriage M4001, whereby the read-processing circuit board is electrically connected to a control system of the printer body M1000 side.

(Configuration of Electric Circuits)

The configuration of electric circuits of the ink-jet printer according to the first embodiment of the present invention is described below.

Figure 7:
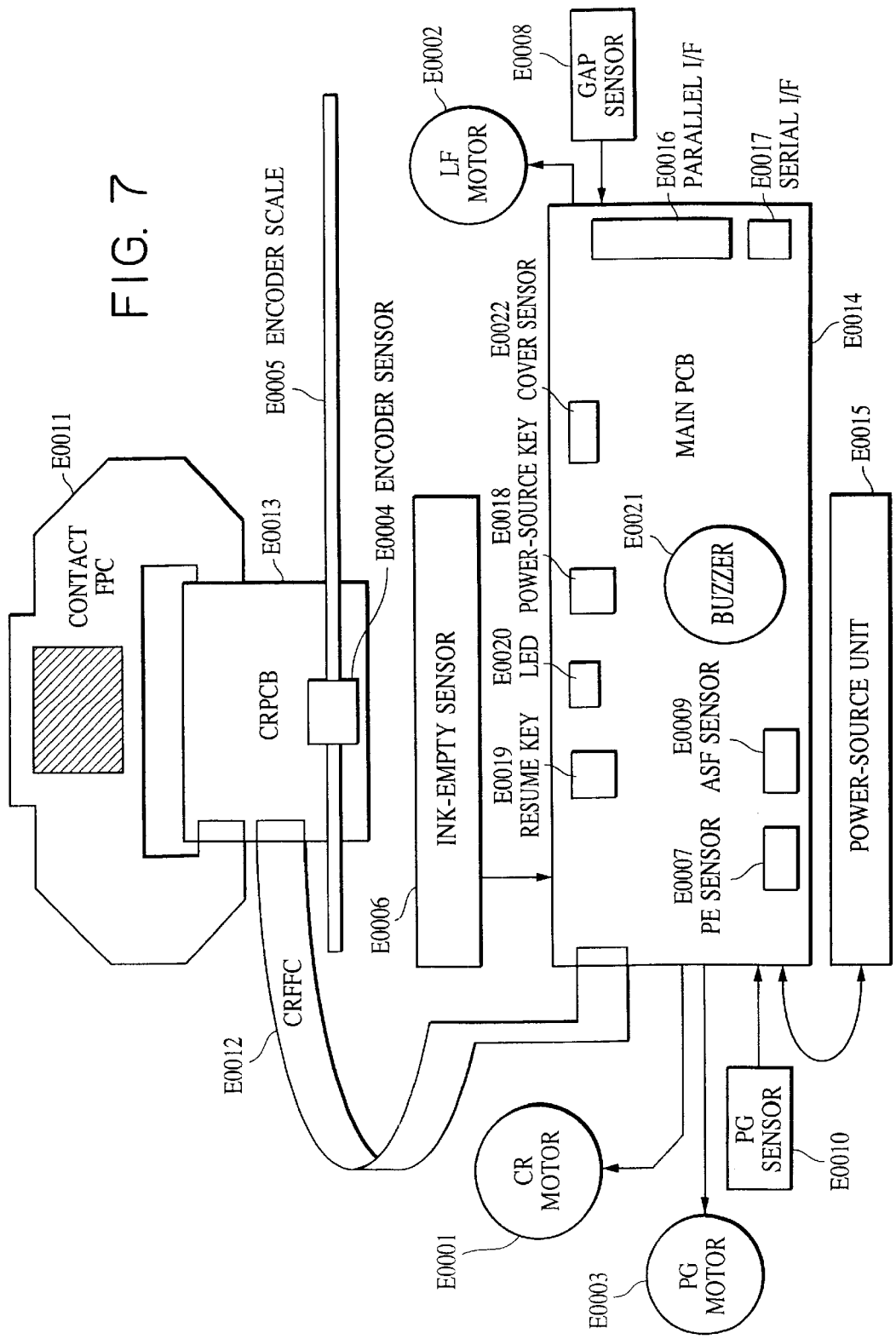
FIG. 7 is a block diagram showing the overall configuration of electric circuits of the ink-jet printer according to the first embodiment of the present invention.

FIG. 7 is a block diagram showing the overall configuration of electric circuits of the ink-jet printer according to the first embodiment.

The electric circuits according to the first embodiment include the carriage printed circuit board (CRPCB) E0013, a main printed circuit board (main PCB) E0014, a power source unit E0015, and the like.

The power source unit E0015 is connected to the main PCB E0014 and supplies driving powers.

The CRPCB E0013 is a printed circuit board unit mounted to the carriage M4001 (see FIG. 2). The CRPCB E0013 serves as an interface for exchanging signals with the ink-jet recording head H1001 via the contact FPC E0011. The CRPCB E0013 determines the relative positions between an encoder scale E0005 and an encoder sensor E0004 in accordance with pulse signals inputted from the encoder sensor E0004 as the carriage M4001 moves, and outputs signals to the main PCB E0014 via a flexible flat cable (CRFFC) E0012.

The main PCB E0014 is a printed circuit board unit which controls the components included in the ink-jet recording apparatus according to the first embodiment. The main PCB E0014 is provided thereon with input/output ports for a paper-edge detecting sensor (P/E sensor) E0007, an automatic sheet-feed (ASF) sensor E0009, a cover sensor E0022, a parallel interface (I/F) E0016, a serial interface (I/F) E0017, the resume key E0019, the LED E0020, the power-source key E0018, a buzzer E0021, and the like. The main PCB E0014 is connected to and controls a CR motor E0001 as a driving source for driving the carriage M1400 for primary scanning, an LF motor E0002 as a driving source for transferring recording media, a PG motor E0003 as a common driving source for rotating the ink-jet recording head H1001 and feeding the recording media. The main PCB E0014 is provided with connection interfaces to an ink-empty sensor E0006, a GAP sensor E0008, a PG sensor E0010, the CRFFC E0012, and the power-source unit E0015.

Figure 8:
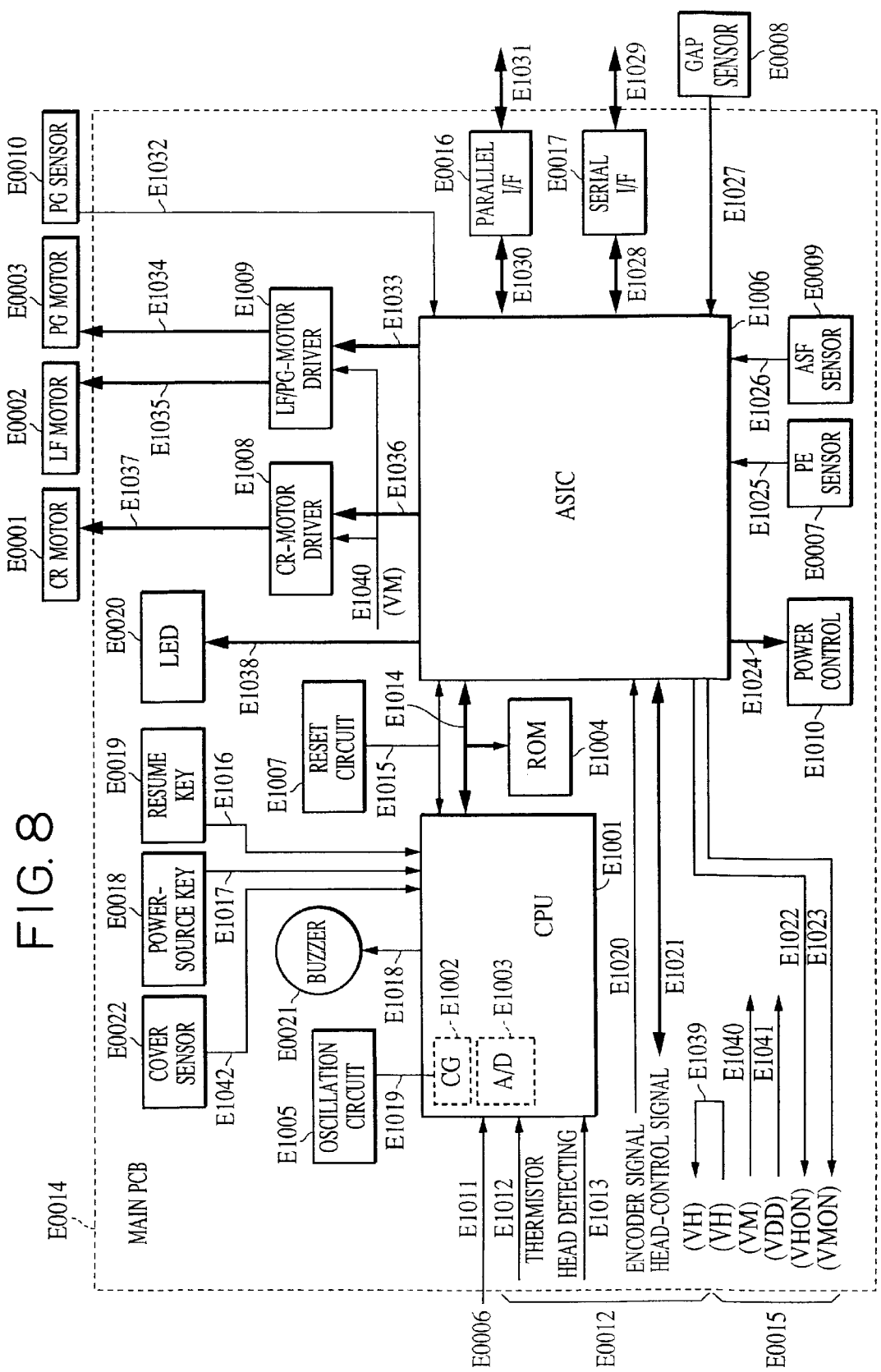
FIG. 8 is a block diagram showing an internal configuration of a main PCB included in the electric circuits shown in FIG. 7.

FIG. 8 is a block diagram showing an internal configuration of the main PCB E0014. A CPU E1001 shown in FIG. 8 includes a clock generator (PCG) E1002 connected to an oscillation circuit E1005 and generates a system clock in accordance with output signals E1019 of the PCG E1002. The CPU E1001 is connected via a control bus E1014 to a ROM E1004 and an application specific integrated circuit (ASIC) E1006. The CPU E1001 controls the ASIC E1006 and determines an input signal E1017 from the power-source key E0018, an input signal E1016 from the resume key E0019, a cover-detecting signal E1042, and a head-detecting signal (HSENS) E1013 according to programs stored in the ROM E1004. The CPU E1001 drives the buzzer E0021 according to a buzzer signal (BUZ) E1018, determines an ink-empty detecting signal (INKS) E1011 and a temperature-determining signal E1012 from a thermistor which are inputted to an A/D converter E1003, and performs various logical operations, condition determinations, and the like, thereby controlling the ink-jet recording apparatus.

The head-detecting signal E1013 is inputted from the ink-jet recording head cartridge H1000 via the flexible flat cable E0012, the carriage printed circuit board E0013, and the contact FPC E0011. The ink-empty detecting signal E1011 is an analog signal which is outputted by the ink-empty sensor E0006. The temperature-determining signal E1012 is also an analog signal from the thermistor (not shown) disposed on the carriage printed circuit board E0013.

A CR-motor driver E1008 produces a CR-motor-driving signal E1037 in accordance with a CR-motor-control signal E1036 from the ASIC E1006 and drives the CR motor E0001 by using a motor-power source (VM) E1040. An LF/PG-motor driver E1009 produces an LF-motor-driving signal E1035 in accordance with a pulse-motor-control signal (PM-control signal) E1033 from the ASIC E1006, thereby driving the LF motor E0002, and produces a PG-motor-driving signal E1034 in accordance with the PM-control signal E1033, thereby driving the PG motor E0003, the LF/PG-motor driver E1009 using the motor-power source E1040.

A power control circuit E1010 controls power supply to sensors and the like which have light-generating elements in accordance with a power control signal E1024 from the ASIC E1006. The parallel I/F E0016 transfers a parallel I/F signal E1030 from the ASIC E1006 to a parallel I/F cable E1031 connected to the outside and a signal from the parallel I/F cable E1031 to the ASIC E1006. The serial I/F E0017 transfers a serial I/F signal E1028 from the ASIC E1006 to a serial I/F cable E1029 connected to the outside and a signal from the serial I/F cable E1029 to the ASIC E1006.

The power source unit E0015 supplies a head power (VH) E1039, the motor power (VM) E1040, and a logic power (VDD) E1041. A head-power-on signal (VHON) E1022 and a motor-power-on signal (VMON) E1023 from the ASIC E1006 are inputted to the power source unit E0015, thereby on/off-controlling the head power E1039 and the motor power E1040. The logic power (VDD) E1041 supplied by the power source unit E0015 is voltage-converted, as needed, and is supplied to internal and external components of the main PCB E0014.

The head power signal E1039 is smoothed on the main PCB E0014, is outputted to the flexible flat cable E0012, and is used for driving the ink-jet recording head cartridge H1000.

A reset circuit E1007 detects the voltage drop of the logic power E1041 and supplies reset signals (RESET) E1015 to the CPU E1001 and the ASIC E1006, thereby performing initialization.

The ASIC E1006 is a single-chip semiconductor-integrated circuit, and is controlled by the CPU E1001 via the control bus E1014. The ASIC E1006 outputs the CR-motor-control signal E1036, the PM-control signal E1033, the power control signal E1024, the head-power-on signal E1022, and the motor-power-on signal E1023. The ASIC E1006 exchanges signals with the parallel I/F E0016 and the serial I/F E0017. The ASIC E1006 determines a PE detecting signal (PES) E1025 from the PE sensor E0007, an ASF detecting signal (ASFS) E1026 from the ASF sensor E0009, and a GAP detecting signal (GAPS) E1027 from the GAP sensor E0008 for detecting a gap between the ink-jet recording head H1001 and a recording medium. The ASIC E1006 transfers data of the determination to the CPU E1001 via the control bus E1014, the CPU E1001 switching on and off the LED E0020 according to the inputted data and controlling an LED-driving signal E1038.

The ASIC E1006 determines an encoder signal (ENC) E1020 and produces a timing signal, and controls recording in cooperation with the ink-jet recording head cartridge H1000 via a head-control signal E1021. The encoder signal (ENC) E1020 is an output signal from the encoder sensor E0004 inputted via the flexible flat cable E0012. The head control signal E1021 is supplied to the ink-jet recording head cartridge H1000 via the flexible flat cable E0012, the carriage PCB E0013, and the contact FPC E0011.

Figure 9:
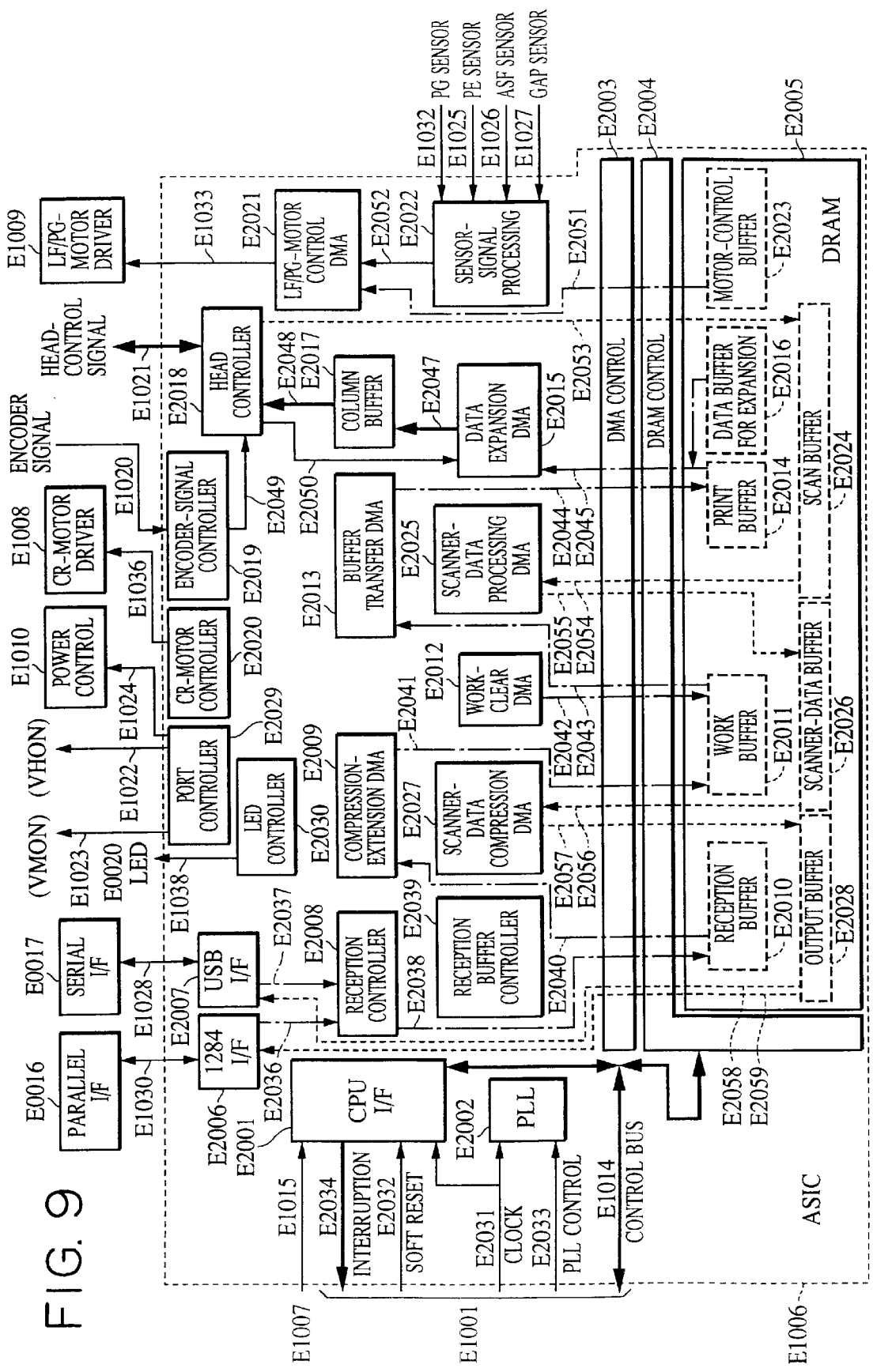
FIG. 9 is a block diagram showing an internal configuration of an ASAIC included in the main PCB shown in FIG. 8.

FIG. 9 is a block diagram showing an internal configuration of the ASAIC E1006.

FIG. 9 only shows data flows between each block regarding control of the head and the other components, such as recording data, motor control data, etc., and control signals related to read from and write on registers contained in the blocks and related to clock and DMA control are omitted so as to avoid complexity of the drawing.

A PLL controller E2002 generates clocks (not shown) to be supplied to almost all the components included in the ASIC E1006, in accordance with a clock signal (CLK) E2031 outputted by the CPU E1001 and a PLL control signal (PLLON) E2033.

A CPU interface (CPUI/F) E2001 controls the blocks to read from and write on the registers, supplies clocks to a part of the blocks, and receives an interruption signal, which are not shown, in accordance with the reset signal E1015, a soft reset signal (PDWN) E2032 outputted by the CPU E1001, the clock signal (CLK) E2031, and control signals from the control bus E1014. The CPU interface E2001 outputs an interruption signal (INT) E2034 to the CPU E1001, thereby informing of an interruption.

A DRAM E2005, as a recording data buffer, has regions for a reception buffer E2010, a work buffer E2011, a print buffer E2014, a data buffer for expansion, and the like. The DRAM E2005 also has a region for a motor-control buffer E2023 for controlling motors, and regions for a scanner-write buffer E2024, a scanner-data buffer E2026, and an output buffer E2005 which are used in a scanning mode.

The DRAM E2005 is also used as a work region required for the operation of the CPU E1001. A DRAM controller E2004 switches between an access from the CPU E1001 to the DRAM E2005 via the control bus E1014 and an access from a DMA controller E2003 described below to the DRAM E2005, and performs read from and write on the DRAM E2005.

The DMA controller E2003 outputs an address signal and a control signal (not shown) and, when writing in, write data E2038, E2041, E2044, E2053, E2055, and E2057 to the DRAM controller E2004, thereby performing DRAM-access. When reading out, the DMA controller E2003 transfers write data E2040, E2043, E2045, E2051, E2054, E2056, E2068, and E2059 to the requesting blocks.

An IEEE1284 interface (I/F) E2006 acts as an interface for interactive communication with an external host computer via the parallel I/F E0016 by being controlled by the CPU E1001 via the CPU I/F E2001. The IEEE1284 I/F E2006, when recording, sends reception data (PIF reception data E2036) from the parallel I/F E0016 to a reception controller E2008 by DMA-processing, and when scanning, sends data (1284 transmission data (RDPIF) E2059) stored in an output buffer E2028 of the DRAM E2005 to the parallel I/F E0016 by DMA-processing.

A universal serial bus interface (USB I/F) E2007 acts as an interface for interactive communication with an external host computer via the serial I/F E0017 by being controlled by the CPU E1001 via the CPU I/F E2001. The USB I/F E2007, when printing, sends reception data (USB reception data E2037) from the serial I/F E0017 to the reception controller E2008 by DMA-processing, and when scanning, sends data (USB transmission data (RDUSB) E2058) stored in the output buffer E2028 of the DRAM E2005 to the serial I/F E0017 by DMA-processing. The reception controller E2008 writes reception data (WDIF E2038) in a reception-buffer write-in address controlled by a reception-buffer controller E2039, the WDIF E2038 being received from selected one interface of the IEEE1284 I/F E2006 and the USB I/F E2007.

A compression-extension DMA controller E2009 reads reception data (raster data (RDWK) E2040) stored on the reception buffer E2010 from a reception-buffer read-out address controlled by the reception-buffer controller 2039, compresses and extends the RDWK E2040 according to a designated mode, and writes the RDWK E2040 on a work buffer region, as a record-code column (WDWK) E2041, by being controlled by the CPU E1001 via the CPU I/F E2001.

A record-buffer-transfer DMA controller E2013 reads record codes (RDWP) E2043 from the work buffer E2011, and performs transfer (WDWP E2044) of the record codes after sorting the same, in an address on a print buffer E2014, in the order of transfer to the ink-jet recording head cartridge H1000, by being controlled by the CPU E1001 via the CPU I/F E2001. A work-clear DMA controller E2012 repeatedly writes a designated work-filler data (WDWF) E2042 on a region on the work buffer E2011, from which the transfer by the record-buffer-transfer DMA controller E2013 has been completed, by being controlled by the CPU E1001 via the CPU I/F E2001.

A record-data-expansion DMA controller E2015 reads the record codes sorted and written on the print buffer and data for expansion written on an expansion data buffer E2016 by using a data-expansion-timing signal E2050 as a trigger, and writes expanded record data (RDHDG) E2045 on a column buffer E2017, as column-buffer written data (WDHDG) E2047, by being controlled by the CPU E1001 via the CPU I/F E2001. The column buffer E2017 is a SRAM for temporarily storing transfer data (the expanded record data) to be transferred to the ink-jet recording head cartridge H1000, and is controlled commonly by a handshaking signal of the record-data-expansion DMA controller E2015 and the head controller E2018.

The head controller E2018 interfaces with the ink-jet recording head cartridge H1000 or a scanner via a head control signal, and outputs a data-expansion-timing signal E2050 to the record-data-expansion DMA controller E2015 in accordance with a head-drive-timing signal E2049 from an encoder-signal processor E2019, by being controlled by the CPU E1001 via the CPU I/F E2001.

When printing, the head controller E2018 reads expanded record data (RDHD) E2048 from the column buffer E2017 according to the head-drive-timing signal E2049, and outputs the expanded record data E2048 to the ink-jet recording head cartridge H1000, as the head control signal E1021.

In a scanning mode, the head controller E2018 DMA-transfers scanned data (WDHD) E2053 inputted as the head control signal E1021 to a scanning buffer E2024 on the DRAM E2005. A scanner-data-processing DMA controller E2025 reads scanning-buffer-read-out data (RDAV) E2054 stored on the scanning buffer E2024 and writes processed data (WDAV) E2055 after smoothing or the like on a scanner-data buffer E2026 on the DRAM E2005 by being controlled by the CPU E1001 via the CPU I/F E2001.

A scanner-data-compression DMA controller E2027 reads processed data (RDYC) E2056 from the scanner-data buffer E2026, compresses the processed data E2056, and write a compressed data (WDYC) E2057 on the output buffer E2028 for transfer, by being controlled by the CPU E1001 via the CPU I/F E2001.

The encoder-signal processor E2019 receives an encoder signal (ENC) and outputs the head-drive-timing signal E2049 according to a mode controlled by the CPU E1001. The encoder-signal processor E2049 stores data regarding the position and speed of the carriage in a register, the data being from an encoder signal E1020, and outputs the same to the CPU E1001. The CPU E1001 determines parameters according to the data for controlling the CR motor E0001. A CR-motor controller E2020 outputs the CR-motor control signal E1036 by being controlled by the CPU E1001 via the CPU I/F E2001.

A sensor-signal processor E2022 receives detection signals E1033, E1025, E1026, and E1027 outputted by the PG sensor E0010, the PE sensor E0007, the ASF sensor E0009, the GAP sensor E0008, etc., and sends these data from the sensors to the CPU E1001 in accordance with a mode determined by the CPU E1001. The sensor-signal processor E2022 outputs a sensor-detection signal E2025 to an LF/PG-motor-control DMA controller E2021.

The LF/PG-motor-control DMA controller E2021 reads a pulse-motor-drive table (RDPM) E2051 from the motor control buffer E2023 on the DRAM E2005 and outputs the PM control signal E1033 by being controlled by the CPU E1001 via the CPU I/F E2001. The LF/PG-motor-control DMA controller E2021 also outputs the PM control signal E1033 by using the sensor-detection signal E2025 as a trigger according to the operational mode.

A LED controller E2030 outputs the LED-drive signal E1038 by being controlled by the CPU E1001 via the CPU I/F E2001. A port controller E2029 outputs the head-power-on signal E1022, the motor-power-on signal E1023, and the power control signal E1024 by being controlled by the CPU E1001 via the CPU I/F E2001.

(Printer Operation)

Figure 10:
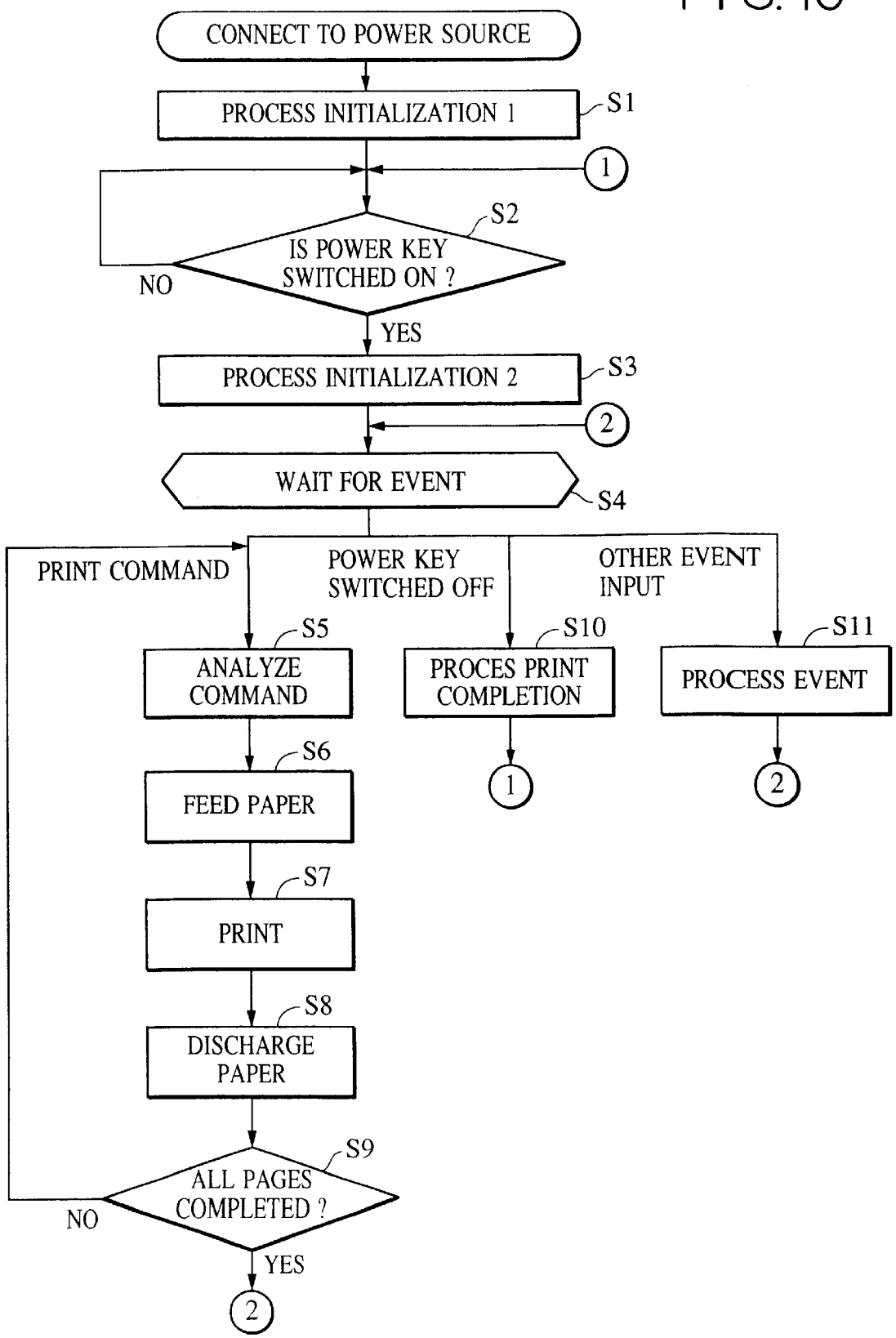
FIG. 10 is a flowchart showing the operation of the ink-jet printer according to the first embodiment of the present invention.

The operation of the ink-jet recording apparatus according to the first embodiment of the present invention is described below with a flowchart shown in FIG. 10.

When the printer body M1000 is connected to an AC source, a first initialization is performed in step S1. In the first initialization, an electric circuit system, such as ROMs and RAMs, is checked, thereby confirming whether or not the printer body M1000 can correctly operate.

In step S2, determination is performed whether or not the power-source key E0018 disposed on the upper case M1002 of the printer body M1000 is in the switched-on position. When the power-source key E0018 is determined to be in the switched-on position, the process proceeds to step S3 in which a second initialization is performed.

In the second initialization, driving mechanisms and the recording head of the printer are checked. That is, confirmation is performed whether or not the printer can correctly operate for initialization of the motors and write-in of head data.

In step S4, event commands are waited for. That is, event commands from external interfaces and through user's panel key operation and internal control events are checked. When an event command is inputted, corresponding processes are performed.

For example, when a print command from the external interface is inputted in step S4, the process proceeds to step S5, and when a power-source-key event is inputted through user's operation in step S4, the process proceeds to step S10. When other events are inputted in step S4, the process proceeds to step S11.

In step S5, the print command from the external interface is analyzed, and indicated sheet type, sheet size, print grade, type of sheet-feed, and the like are determined. The data of the result of the determination are stored in the DRAM E2005, and the process proceeds to step S6.

In step S6, sheet-feeding starts in a way as indicated in step S5, a sheet is fed to the recording position, and the process proceeds to step S7.

Recording is performed in step S7. In the recording process, recording data inputted from the external interface are once stored in the print buffer E2014, the CR motor E0001 drives the carriage M4001 in a primary scanning direction, and recording is performed for one line by supplying the recording data stored in the print buffer E2014 to the recording head H1001. When recording of the one line is completed, the LF motor E0002 is driven, and an LF roller M3001 rotates for transferring the sheet in a secondary scanning direction. The above operations are repeatedly performed, and when recording of recording data for one page of the sheet inputted from the external interface is completed, the process proceeds to step S8.

In step S8, a sheet-discharge roller M2003 is driven by the LF motor E0002, thereby repeating sheet-transfer operations until determining that the sheet has been completely discharged from the printer so that the sheet is disposed on the discharge tray M1004a.

In step S9, it is determined whether or not the recording operation for the all sheets to be recorded is completed. When it is determined that there are remaining sheets to be recorded, the process returns to step S5, and processes in steps S5 to S9 are repeated. When it is determined that no sheet remains to be recorded, the recording is completed, and the process proceeds to step S4 for the subsequent event.

In step S10, a process for completing the printer operation. That is, the printer is put into a state in which the power to the motors and the head can be switched off, and the power is switched off.

In step S11, events other than those described above are processed. For example, recovery commands from various panel keys of the printer body M1000 and external interfaces and internal recovery events are processed. After recovery, the process proceeds to step S4 for the subsequent event.

The ink-jet recording apparatus according to the first embodiment of the present invention is characterized in that film boiling of a liquid is realized by using thermal energy generated by electrothermal transducers, thereby forming bubbles in the liquid.

Embodiments of the wiring electrodes used in the above ink-jet recording apparatus are described below.

Figure 11:
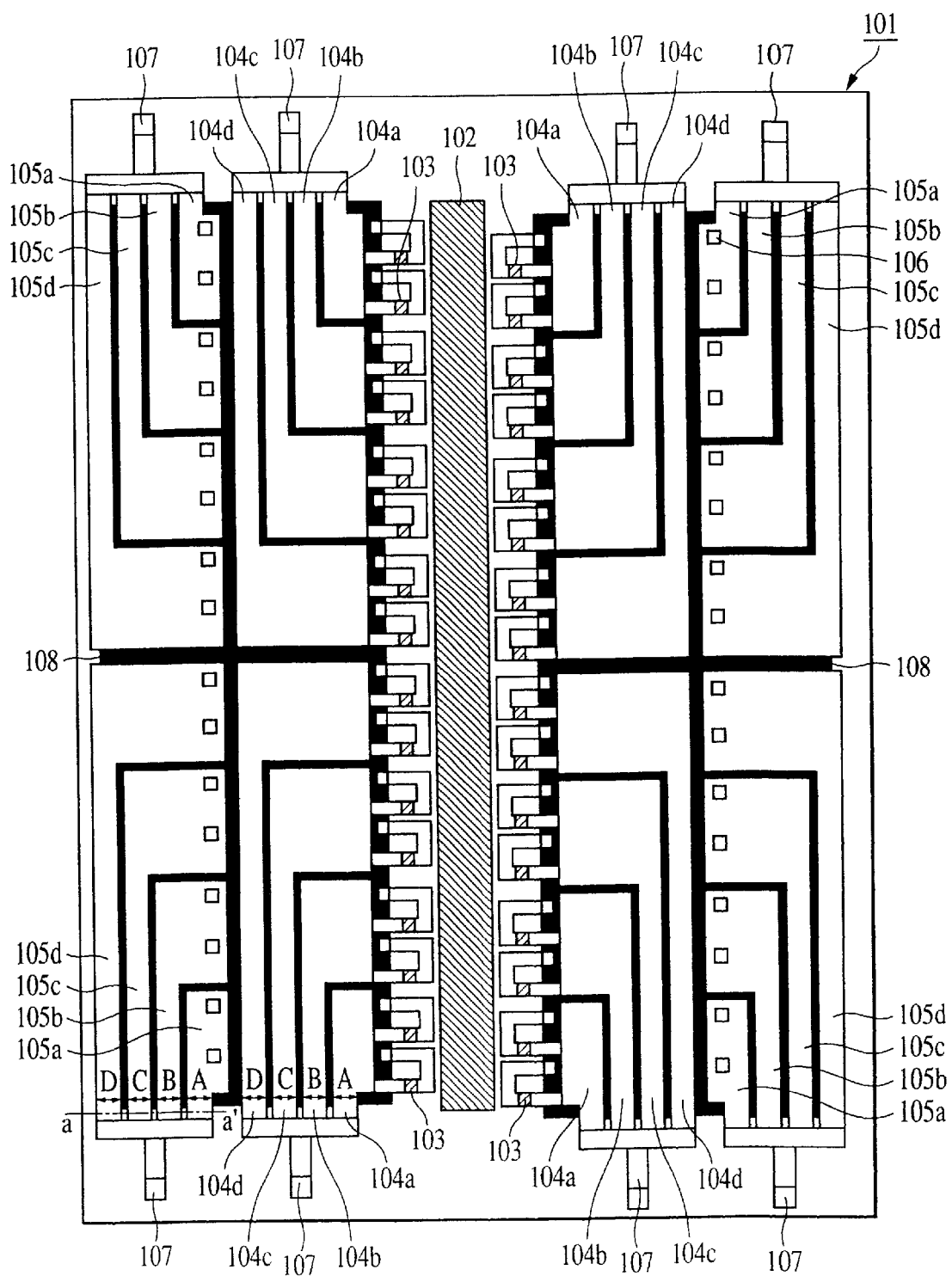
FIG. 11 is a plan view mainly showing wiring electrodes used in a circuit board for an ink-jet recording head, according to a second embodiment of the present invention.
Figure 12:
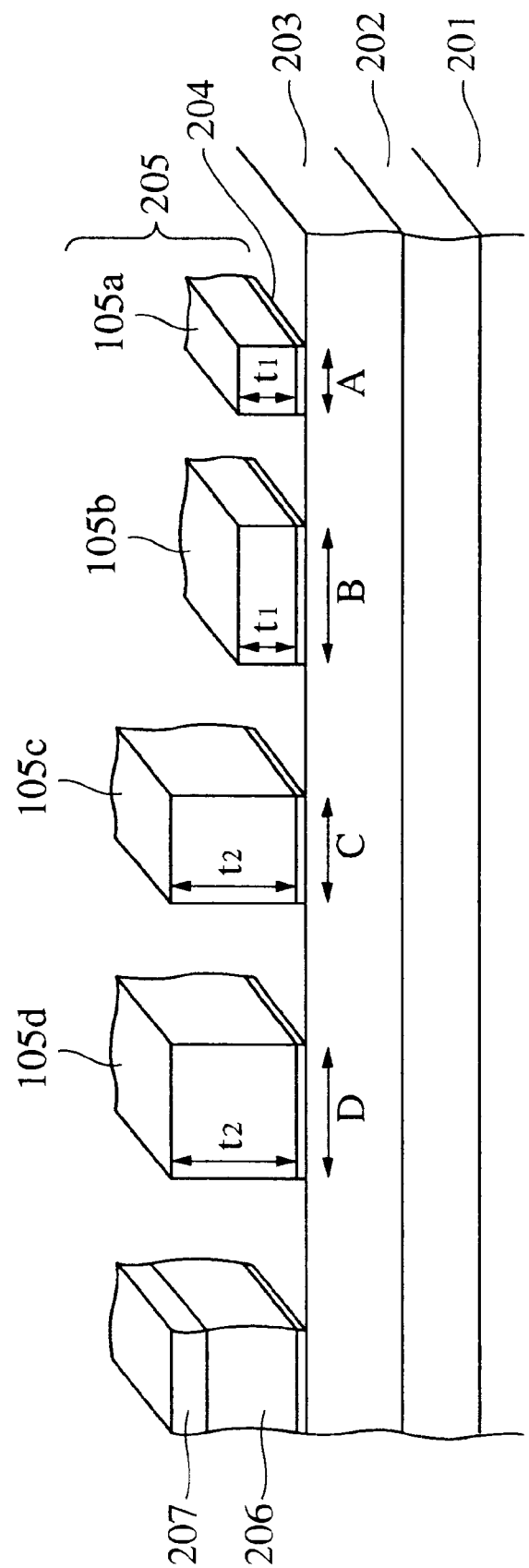
FIG. 12 is an illustration showing the relationship of dimensions between each of a plurality of wiring electrodes used in the circuit board for an ink-jet recording head, according to the second embodiment of the present invention.

FIG. 11 is a plan view mainly showing wiring electrodes used in a circuit board for an ink-jet recording head, according to a second embodiment of the present invention. FIG. 12 is a section along line a–a' of the wiring electrodes shown in FIG. 11 showing the relationship of dimensions between each of a plurality of wiring electrodes and the configuration thereof.

Figure 23:
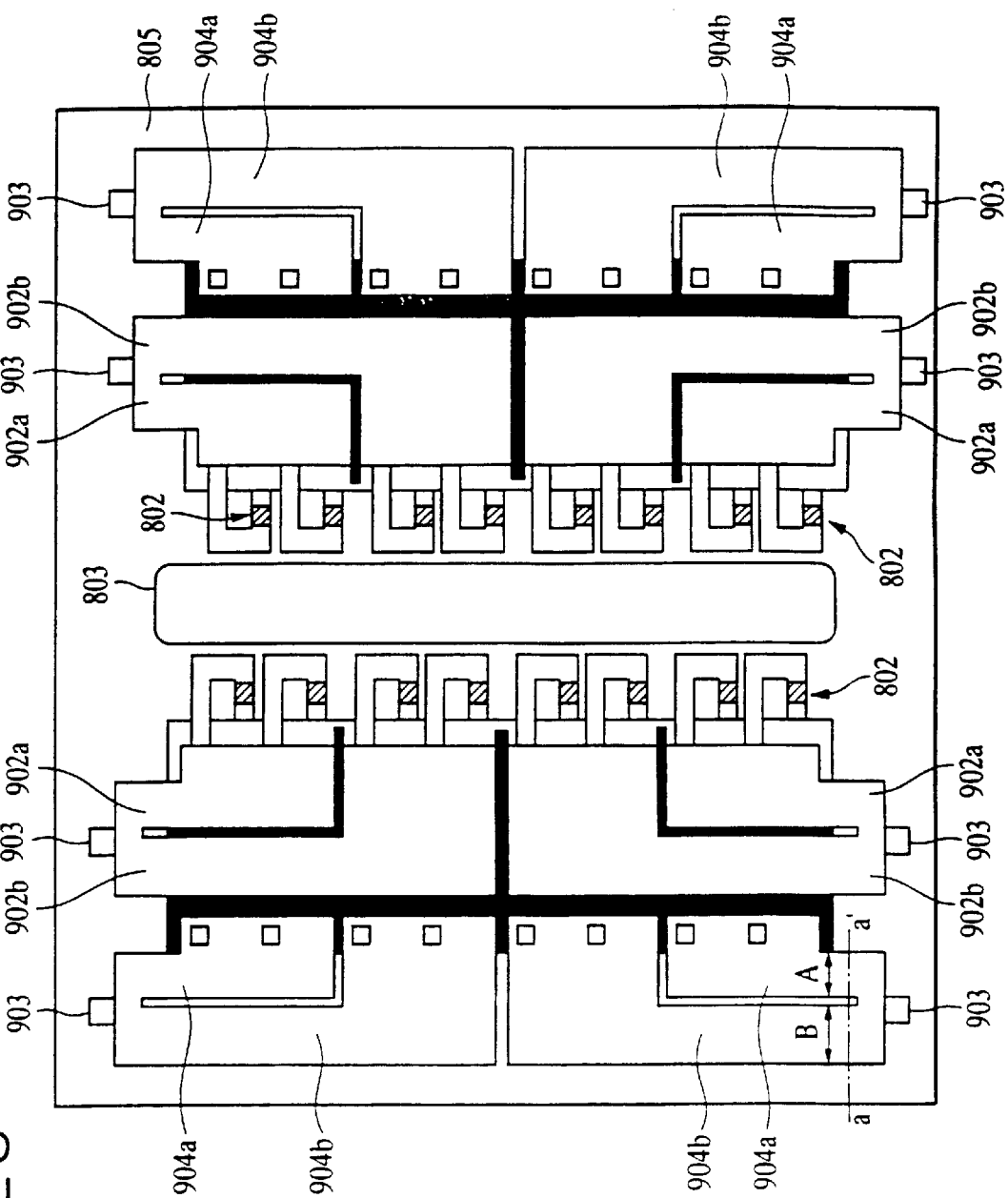
FIG. 23 is a plan view mainly showing wiring electrodes of the circuit board used in the known ink-jet recording head.

The configuration of a circuit board 101 according to the second embodiment is basically the same as that of the known circuit board shown in FIG. 23. The circuit board 101 differs from the known circuit board shown in FIG. 23 differs in that the width and/or the thickness of each common wiring electrode of the circuit board 101 vary according to the length thereof. According to the present invention, the wiring electrodes may vary only in thickness so that the above-described object of the present invention can be achieved.

The circuit board 101 shown in FIG. 11 is provided with an ink-supply opening 102 at an intermediate part thereof, and a plurality of electrothermal transducers (heaters) 103 along the longitudinal edges of the ink-supply opening 102, electrothermal transducers 103 opposing each other in a staggered way across the ink-supply opening 102 alternately offset from each other by a distance of a half of each electrothermal transducer 103. Each heater 103 includes a heat-generating resistor. A set of the adjacent two heaters 103 is connected to a source-side common wiring electrode 104a, 104b, 104c, or 104d and a drive element 108 as a selectively driven switching element such as a transistor. The drive element 108 is connected to a ground-side common wiring electrode 105a, 105b, 105c, or 105d. By forming the above circuit, each set of the heaters 103 can be driven selectively according to recording data, thereby ejecting ink through corresponding ejection ports.

Each of the source-side common wiring electrodes 104a, 104b, 104c, and 104d and the ground-side common wiring electrodes 105a, 105b, 105c, and 105d is provided with an electrode pad 107, through which each heater 103 is connected to a power source and a grounding circuit. The ground-side common wiring electrodes 105a to 105d are individually connected to the drive elements 108 via through-holes 106.

In FIG. 11, the source-side common wiring electrodes 104a, 104b, 104c, and 104d or the ground-side common wiring electrodes 105a, 105b, 105c, and 105d have widths A, B, C, D, respectively, according to the respective lengths of the source-side common wiring electrodes 104a, 104b, 104c, and 104d or the ground-side common wiring electrodes 105a, 105b, 105c, and 105d, respectively. These widths of the wiring electrodes are not necessarily large as the wiring electrodes become longer. The resistance of each wiring electrode, which is obtained in relation to the length, width, and thickness thereof, is set to be the same as that of other wiring electrodes.

FIG. 12 shows an arrangement in the size of the wiring electrodes for obtaining a uniform resistance for each wiring electrode. Hereinafter, the source-side common wiring electrodes 104a, 104b, 104c, and 104d and the ground-side common wiring electrodes 105a, 105b, 105c, and 105d are generally referred to as "common wiring electrodes 105a, 105b, 105c, and 105d".

In FIG. 12, the common wiring electrodes 105a and 105b and the common wiring electrodes 105c and 105d have thicknesses $t_1$ and $t_2$, respectively. The resistance of each wiring electrode is made substantially the same as that of other wiring electrodes between the electrode pads 107 and the heaters by setting the thicknesses $t_1$ and $t_2$ in combination with the widths of the respective wiring electrodes. When the length of the common wiring electrode 105d which is the longest wiring electrode is set to 4 in ratio (the length, width, and thickness are hereinafter referred to in ratio), the lengths of the common wiring electrodes 105c, 105b, and 105a are set to 3, 2, and 1, respectively. In this case, the widths D, C, B, and A are set to 2, 1.5, 2, and 1, respectively. The thicknesses of the common wiring electrodes 105d, 105c, 105b, and 105a are set to $t_2$, $t_2$, $t_1$, and $t_1$, respectively. By thus setting the values of the widths and thicknesses according to the lengths of the corresponding wiring electrodes, the resistance of each common wiring electrode can be made substantially the same as that of other common wiring electrodes (the ratio between (width× thickness) and (length of wiring) is made equal for each wiring electrode). With this arrangement, the difference between each heater in the electric energy inputted thereto can be reduced regardless of the number of heaters driven at the same time because not only the width but also the thickness of the common wiring electrodes are controlled so as to minimize the resistance of the wiring electrodes, that is, to minimize the effect of the voltage drop during driving the heaters due to the common wiring electrodes. The ratio 4, 3, 2, 1 of the lengths of the wiring electrodes does not correspond to the actual lengths thereof since each wiring electrode does not have a uniform shape, as shown in FIG. 11. However, the actual lengths can be represented by the resistance of each wiring electrode when the width and thickness are the same for each wiring electrode shown in FIG. 12.

The resistance of the wiring electrodes according to the present embodiment can be controlled more freely than that of the known wiring electrodes shown in FIG. 23, when they are formed on circuit boards having the same size as each other.

Figure 18:
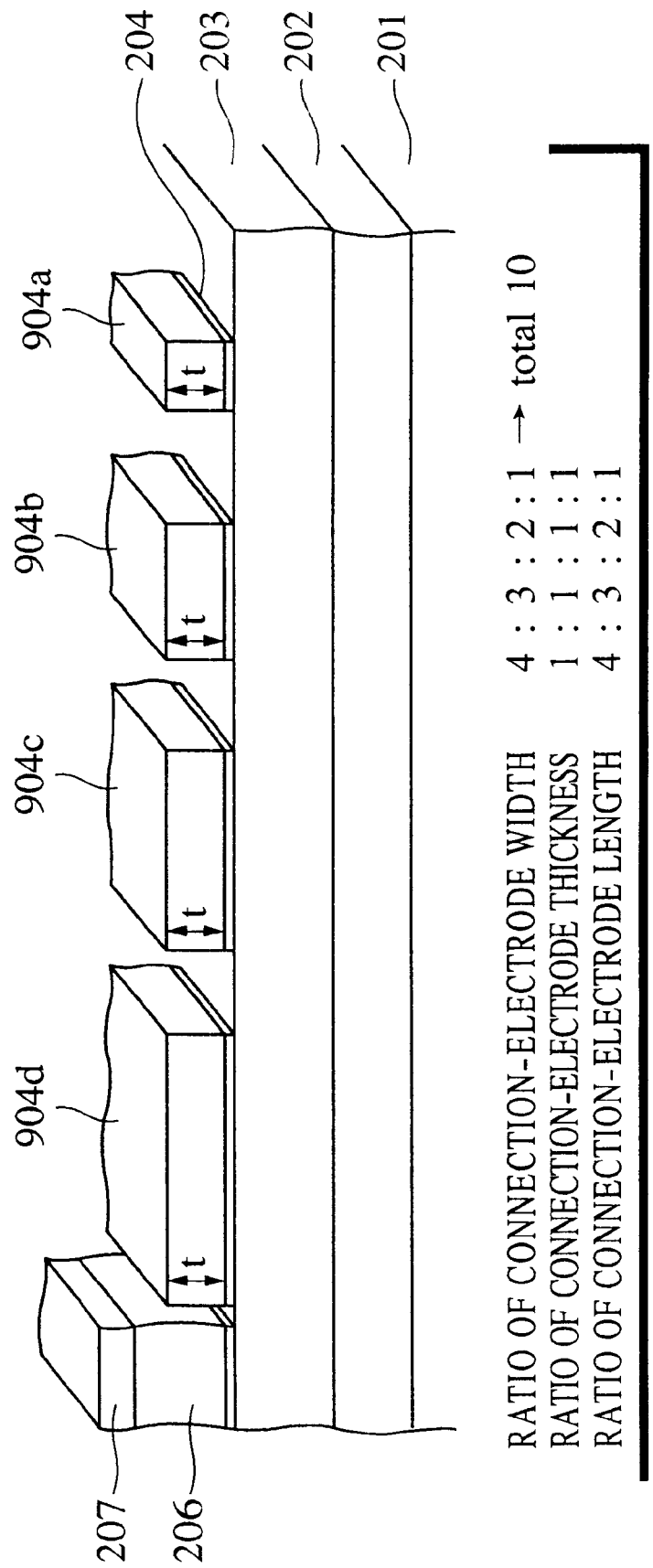
FIG. 18 is an illustration showing the relationship of dimensions of each of a plurality of wiring electrodes used in a comparative example of a circuit board for an ink-jet recording head according to the present invention.

When controlling the resistance of the wiring electrodes only by varying width thereof, as in a comparative example shown in FIG. 18 which is arranged in the same way as in the known wiring electrodes, the width increases according to the length of the wiring electrodes because the thickness of each wiring electrode has the same value t. Therefore, the total value of the width becomes 10, that is, the area of region which is occupied by the wiring electrodes becomes larger than that in the case shown in FIG. 12. The total width of the wiring electrodes according to the second embodiment of the present invention is 6.5, which is 0.65 times the value of the total width of the known wiring electrodes. With this arrangement, the problem due to the difference in resistance between the wiring electrodes can be overcome at a low manufacturing cost and without increasing the size of the circuit board. The effect of this arrangement becomes more remarkable as the number of heaters increases and the circuit board thereby extends further along the ink-supply opening.

A method for manufacturing the circuit board shown in FIGS. 11 and 12, according to the second embodiment, is described below.

In FIG. 12, the drive elements 108 (see FIG. 11) are formed on a substrate 201 made of a silicon (Si) wafer in an NMOS process. The drive elements 108 drive the heaters 103 in accordance with the recording data signal, clock signal, pulse-width signal, etc., which are inputted from the outside to the drive elements 108 at input terminals thereof (not shown). On the substrate 201, heat-accumulation layer 202 having a thickness of 1700 nm of SiN, SiO$_2$, or the like is formed by thermal oxidation, sputtering, chemical vapor deposition (CVD), or the like, and a first aluminum electrode layer (not shown) having a thickness of 500 nm is formed by sputtering, during the manufacturing process of the drive elements 108. Inter-layer insulating layer 203 having a thickness of 1400 nm of SiN, SiO$_2$, or the like is formed on the first aluminum electrode layer by sputtering, CVD, or the like. Next, a heat-generating resistor layer 204 having a thickness of 15 nm of TaN, TaSiN, or the like is formed, then, a second aluminum layer 205 having a thickness of 800 nm for forming the respective ground-side and source-side common wiring electrodes and connecting the heat-generating resistors to the respective ground-side and source-side common wiring electrodes is formed, by sputtering or reactive sputtering.

Then, the patterns of the common wiring electrodes are formed by photolithography, the wiring electrode layer and the heat-generating resistor layer being successively formed by reactive ion etching.

A method for forming the common wiring electrodes having thicknesses differing from each other is described below. One electrode layer having a given thickness is deposited and is formed in patterns such that the patterned electrode layer remains in the given thickness. This process is repeated in the number of times corresponding to the number of thickness values. Another method is that in which an electrode layer having a largest desired thickness is deposited, and is patterned by photolithography so that required patterns are formed. The overall substrate provided with the patterned electrodes is covered by a resist, and the electrodes, of which thickness is required to be reduced, are exposed. The thickness of the exposed electrodes is reduced to a desired value by etching. The process is repeated, whereby the electrodes are formed to have desired thicknesses.

Figure 13:
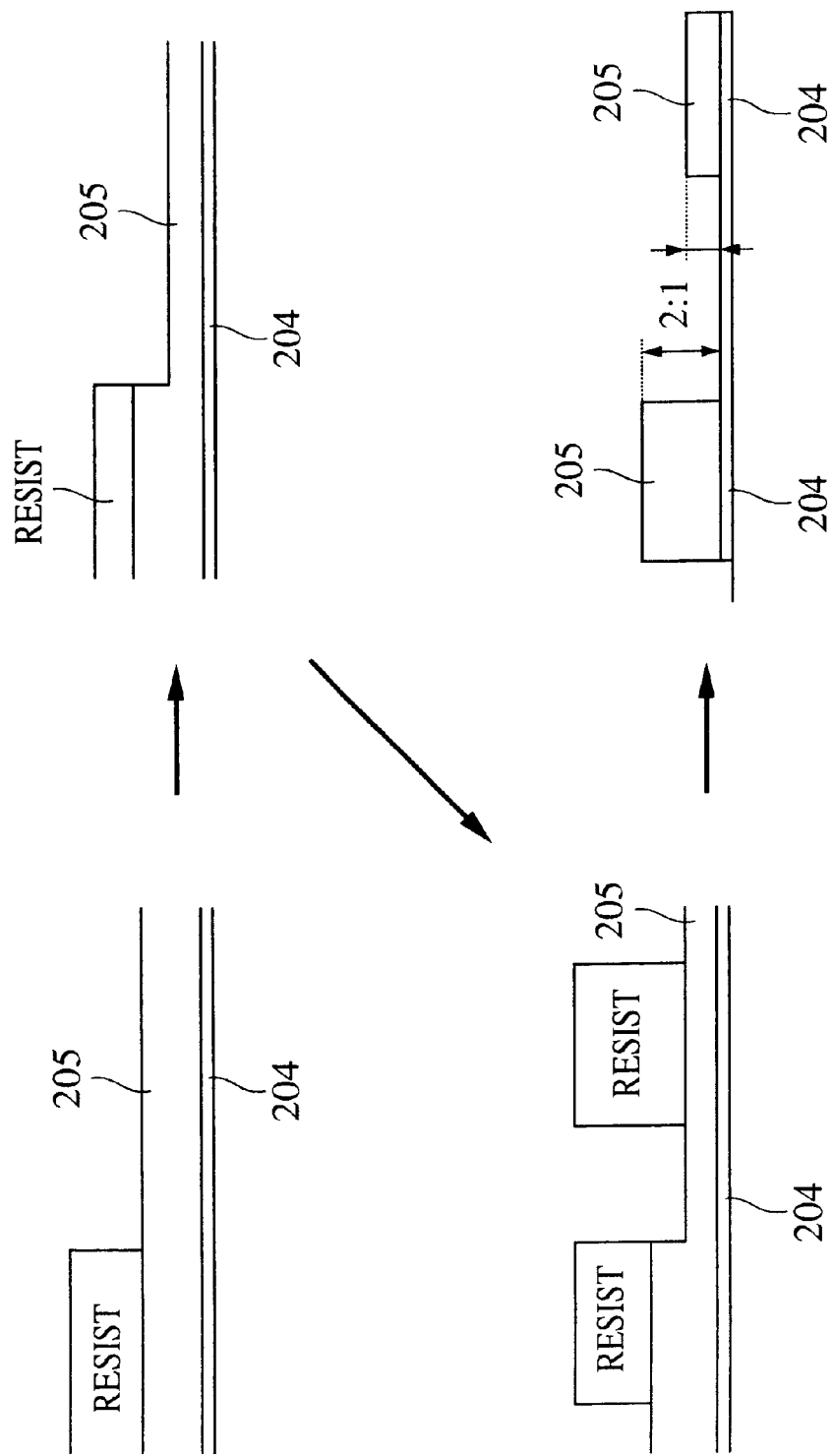
FIG. 13 is an illustration showing a manufacturing process of the wiring electrodes shown in FIG. 12.

In FIG. 13, a resist is applied to the second aluminum layer 205 deposited on the heat-generating resistor layer 204 in the left portion of the second aluminum layer 205 in the drawing, and the thickness of the second aluminum layer 205 is reduced by half-etching in the right portion thereof. Then, the resist is applied to the second aluminum layer 205 in a part in the portion of the second aluminum layer 205, the thickness of which is reduced, which is desired to be kept as a wiring electrode, and the second aluminum layer 205 is etched until the heat-generating resistor layer 204 is exposed, and the resist is removed, whereby the wiring electrodes having different thicknesses are obtained. According to the second embodiment, the thicknesses $t_1$ and $t_2$ are set to 400 nm and 800 nm, respectively. The second aluminum layer 205 is removed by wet etching so as to again expose the heat-generating resistor layer 204.

Next, an insulative film 206 for protection having a thickness of 1000 nm of SiN, SiO2, or the like is formed by sputtering, CVD, or the like, and a cavitation-resistive and ink-proof film 207 having a thickness of Ta is formed by being patterned, as needed. Thus, the circuit board for an ink-jet recording head, according to the second embodiment, is manufactured.

Figure 14:
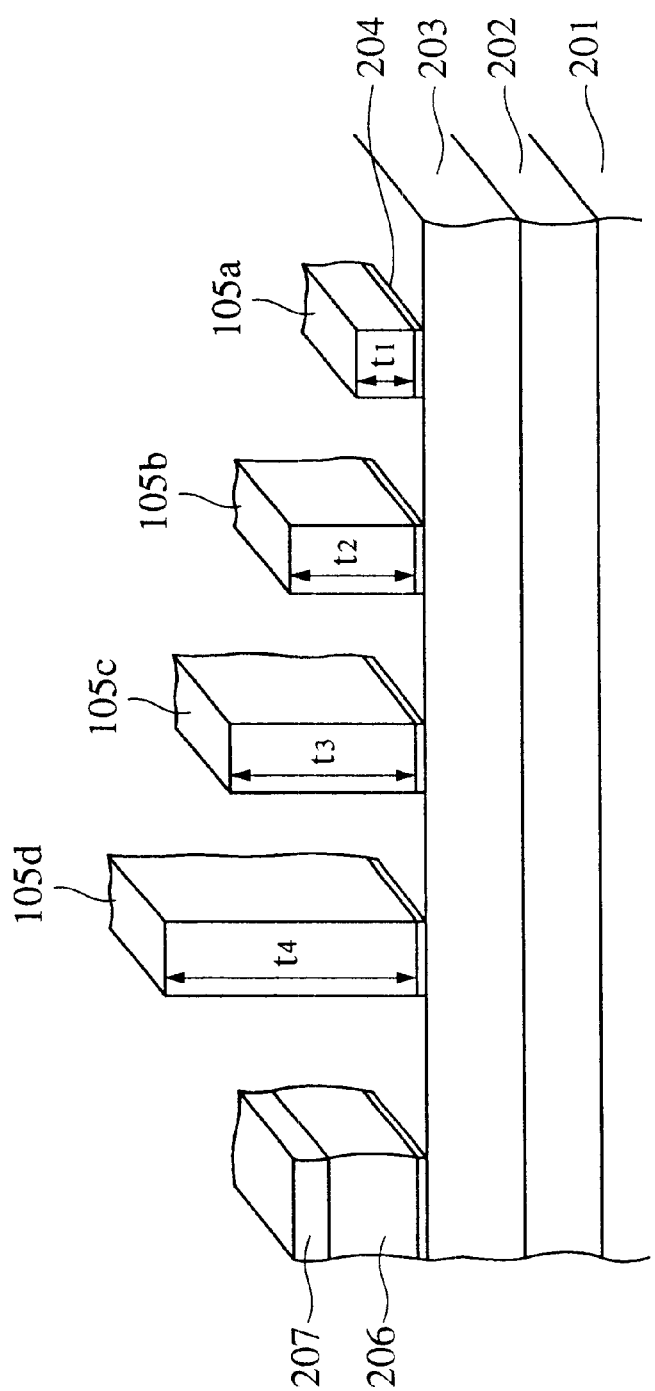
FIG. 14 is an illustration showing the relationship of dimensions between each of a plurality of wiring electrodes used in a circuit board for an ink-jet recording head, according to a third embodiment of the present invention.

FIG. 14 is a section of wiring electrodes used in a circuit board for an ink-jet recording head, according to a third embodiment of the present invention. The drawing shows the relationship of dimensions between each wiring electrode.

In FIG. 14, each wiring electrode according to the third embodiment has a width the same as that of the others and a thickness which differs, in accordance with the length of the wiring electrode, from that of the others. The thicknesses of the respective common wiring electrodes 105a, 105b, 105c, and 105d are set to 1, 2, 3, and 4 in accordance with the lengths of the common wiring electrodes 105a, 105b, 105c, and 105d which are 1, 2, 3, and 4, respectively. In this case, the resistance of the wiring electrodes can become substantially the same for each wiring electrode when the total value of the width of the wiring electrodes is 4. That is, the area of the wiring electrodes on the circuit board can be made smaller than that in the second embodiment, which is 0.4 times that of the known wiring electrodes. With this arrangement, the difference between each heater in the electric energy inputted thereto can be reduced regardless of the number of heaters driven at the same time, as in the second embodiment. The wiring electrodes according to the third embodiment can be manufactured in the same processes as those which are described in the second embodiment.

Figure 15:
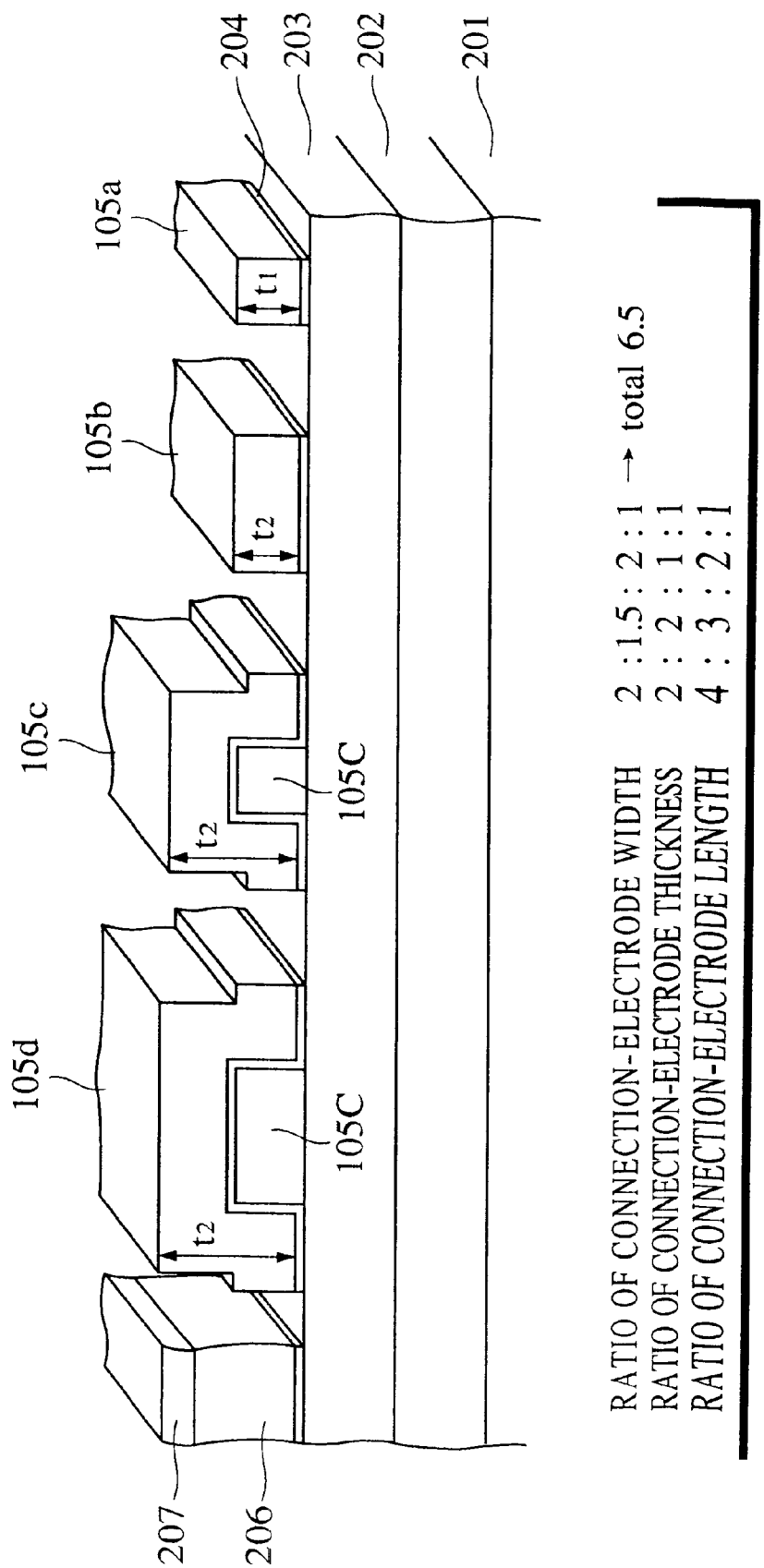
FIG. 15 is an illustration showing the relationship of dimensions of each of a plurality of wiring electrodes used in a circuit board for an ink-jet recording head, according to a fourth embodiment of the present invention.

FIG. 15 is a section of wiring electrodes used in a circuit board for an ink-jet recording head, according to a fourth embodiment of the present invention. The drawing shows the relationship of dimensions between each wiring electrode.

According to the fourth embodiment, the ratio of thickness between each wiring electrode is the same as that in the second embodiment, that is, the thicknesses of the wiring electrodes 105a, 105b, 105c, and 105d are 1, 1, 2, and 2, respectively. The wiring electrodes according to the fourth embodiment differs from those in the second embodiment in that each wiring electrode includes a plurality of layers so that the thickness of each wiring electrode differs from that of the others. In the fourth embodiment, the wiring electrodes 105c and 105d are each formed in two layers, whereby a desired thickness t2 is obtained.

Figure 16:
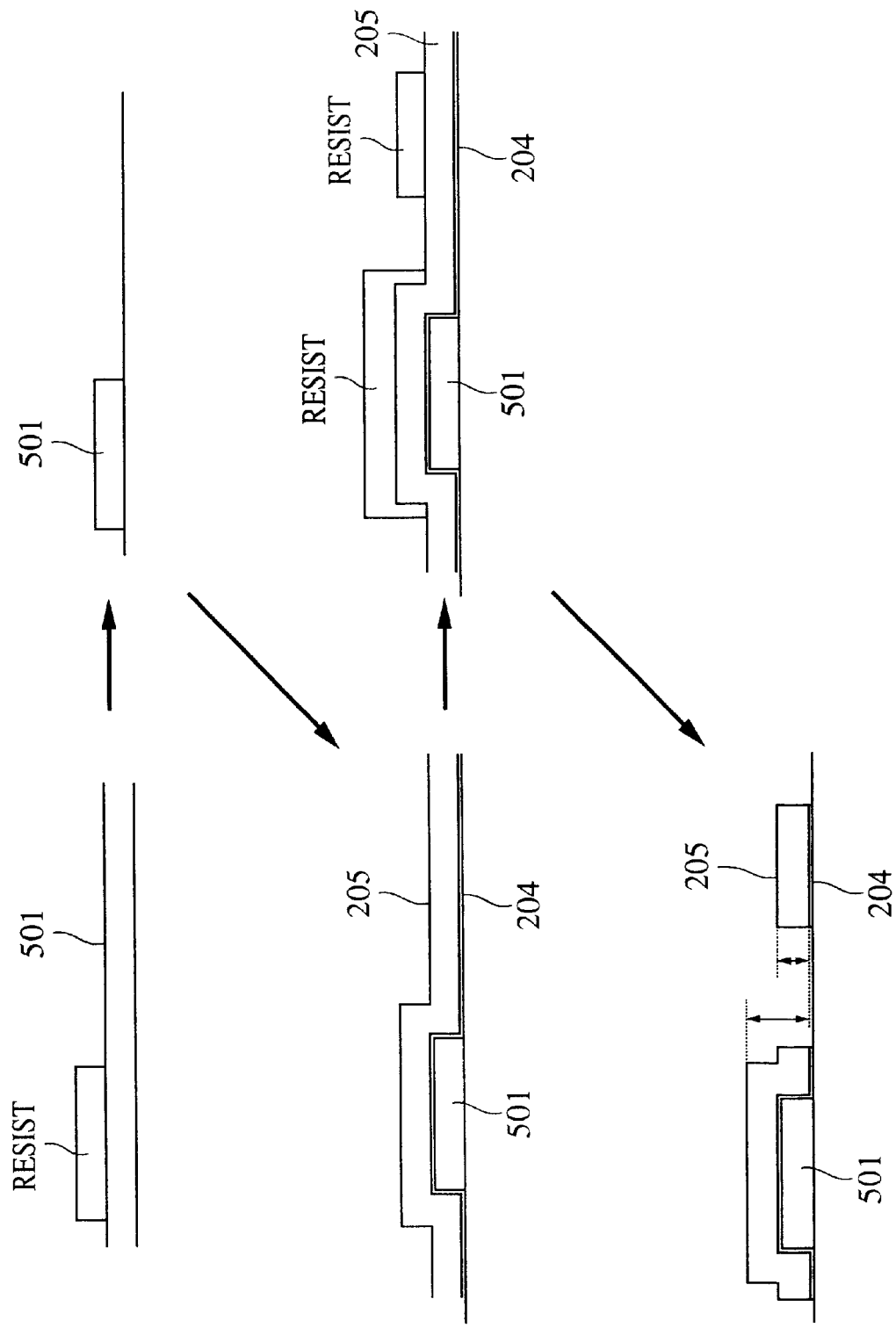
FIG. 16 is an illustration showing a manufacturing process of the wiring electrodes shown in FIG. 15.

FIG. 16 shows a method for manufacturing a circuit board provided with the wiring electrodes shown in FIG. 15. The circuit board is processed in the same manner as in the second embodiment until forming the inter-layer insulative layer (not shown). In FIG. 16, a first aluminum layer 501 having a thickness of 400 nm is formed by sputtering or reactive sputtering for forming the common wiring electrodes 105c and 105d. Wiring patterns are formed by photolithography, and the first aluminum layer 501 is etched by reactive ion etching. In this case, reverse sputtering may be applied as is required from the state of a surface (oxidation or the like) of the first aluminum layer 501 in consideration of adhesiveness to a heat-generating resistor layer which is subsequently formed.

Then, a heat-generating resistor layer 204 having a thickness of 15 nm of TaN, TaSiN, or the like, and a second aluminum layer 205 as wiring electrodes having a thickness of 400 nm, which individually connects heat-generating resistors to the common wiring electrodes 105a and 105b, upper layers of the respective common wiring electrodes 105c and 105d, and the source-side common wiring electrodes, are successively formed by sputtering or reverse sputtering. Wiring patterns are formed by photolithography, and the second aluminum layer 205 and the heat-generating resistor layer 204 are successively etched by reactive ion etching. Although in the fourth embodiment, the wiring electrodes each having two layers are used, the wiring electrodes may have more than two layers, as desired in designing of a circuit board.

The aluminum layer is removed by wet etching so as to expose the heaters by photolithography. An insulative film 206 as protection film having a thickness of 1000 nm of SiN, SiO2, or the like is formed by sputtering, CVD, or the like, and a cavitation-resistive and ink-proof film 207 having a thickness of 230 nm of Ta is formed by being patterned, as needed, whereby the circuit board for an ink-jet recording head, according to the fourth embodiment is obtained.

Figure 17:
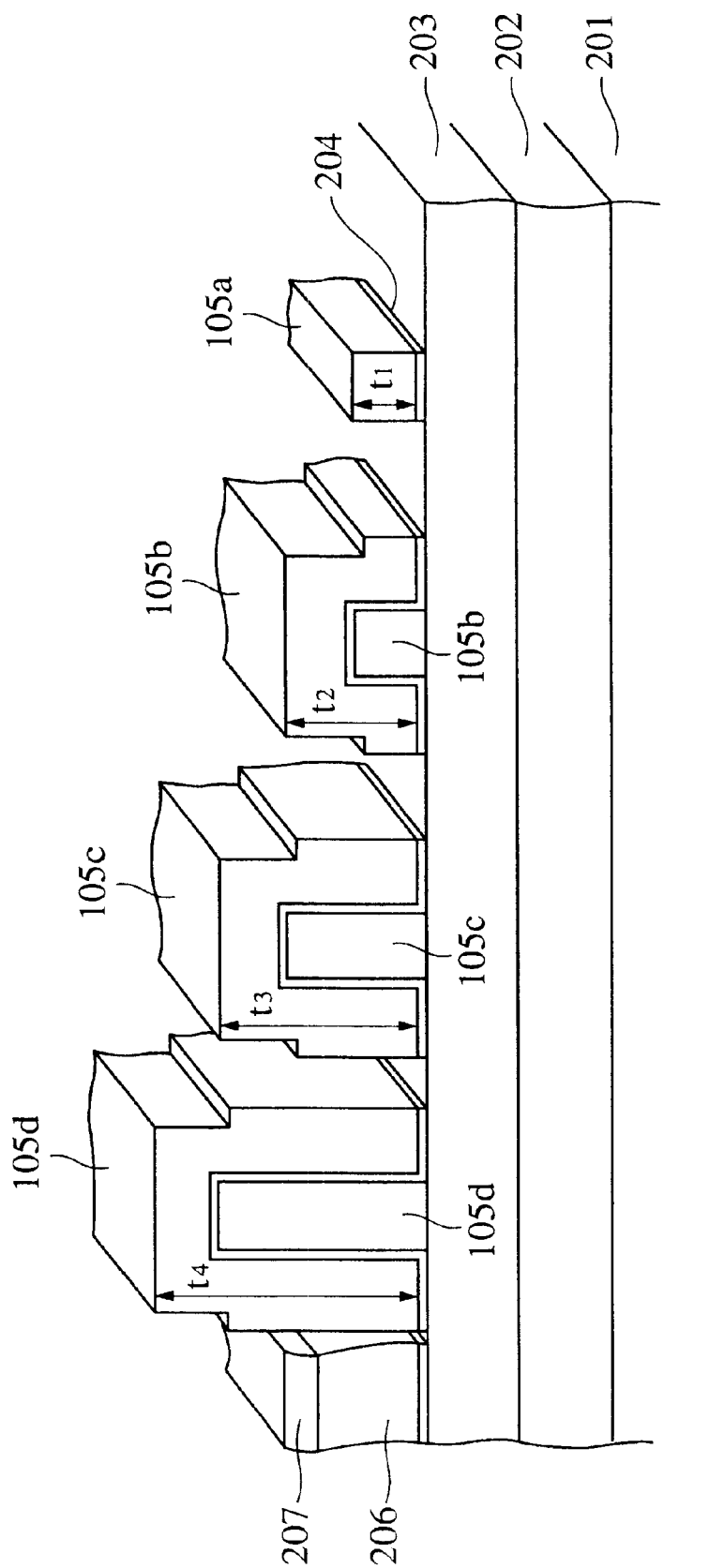
FIG. 17 is an illustration showing the relationship of dimensions of each of a plurality of wiring electrodes used in a circuit board for an ink-jet recording head, according to a fifth embodiment of the present invention.

FIG. 17 is an illustration of wiring electrodes used in a circuit board for an ink-jet recording head, according to a fifth embodiment of the present invention. The drawing shows the relationship of dimensions between each wiring electrode. The wiring electrodes according to the fifth embodiment have a configuration the same as that of the wiring electrodes according to the third embodiment except for that the thickness of each wiring electrode differs from that of the others by being provided with a plurality of layers, as described in the fourth embodiment.

The manufacturing method is the same as that which is described in the second to fourth embodiments. That is, a lower aluminum layer is formed in the steps shown in FIG. 13, and an upper aluminum layer (wiring layer) is formed in the steps shown in FIG. 16.

According to the fifth embodiment, the same effect as that of the third embodiment can be obtained.

Other embodiments according to the present invention are described by using the ink-jet recording apparatus and the ink-jet recording head shown in FIGS. 1 to 10.

(Ink-Jet Recording Head)

Figure 19:
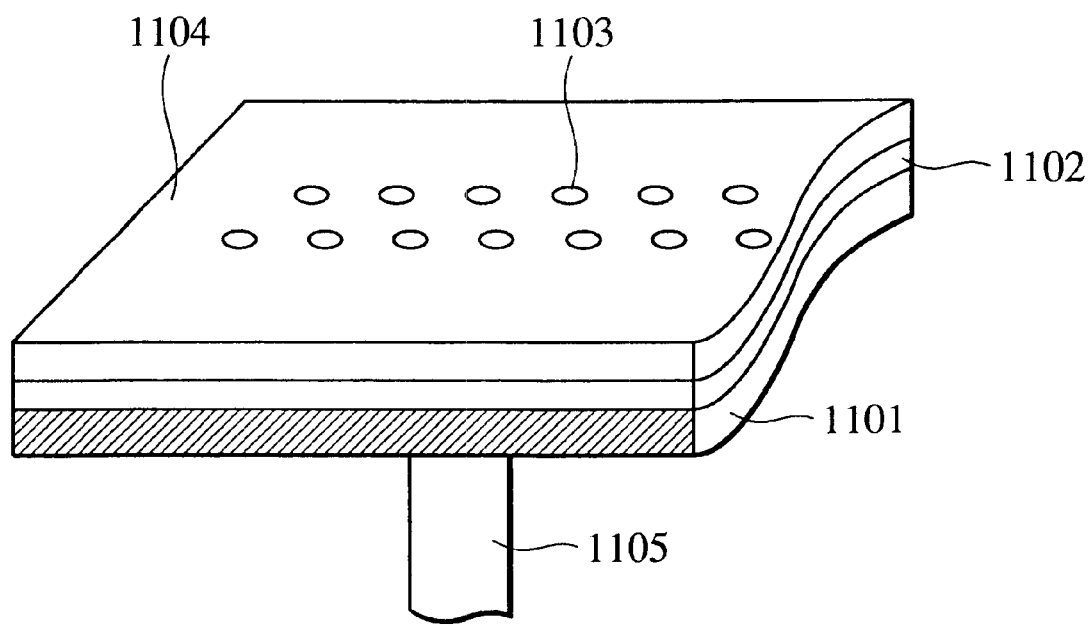
FIG. 19 is a perspective view of another example of the ink-jet recording head according to the present invention.

FIG. 19 is a perspective view of another example of the ink-jet recording head which uses one of the circuit boards for ink-jet recording heads described in the above embodiments, the ink-jet recording head being a side-shooter-type.

The ink-jet recording head according to the present embodiment includes a circuit board 1101 formed in the same manner as in the above embodiments, which is laminated thereon with a photosensitive resin for forming liquid-flow paths and a flow-path-wall plate 1102 formed by photolithography. An orifice plate 1104 provided with ejection ports 1103 formed therein is formed by electroforming. The orifice plate 1104 is bonded to the flow-path-wall plate 1102, whereby the ejection ports, liquid-flow paths, and a liquid chamber are formed at the same time. Lastly, an ink-supply pipe 1105 is bonded to the circuit board 1101 at a portion which is provided with an ink-supply opening. The thus formed ink-jet recording head and an ink tank for receiving ink assembled with each other form an ink-jet recording head cartridge. In particular, an ink-jet recording head cartridge which can perform color recording is obtained by combining the ink tanks receiving a plurality of colors and circuit boards, each combination associating with a color.

Each ink tank of which ink has been used out may be refilled with the ink. Therefore, each ink tank is preferably provided with a liquid inlet. The ink-jet recording head and the ink tanks may be formed integrally with each other, or may be formed independently from each other. In the thus manufactured ink-jet recording head and the ink-jet recording head cartridge, bubbles can be stably produced because driving energy is always inputted properly to each heater, an ink-jet recording head having a long durability can be provided.

(Ink-Jet Recording Apparatus)

Figure 20:
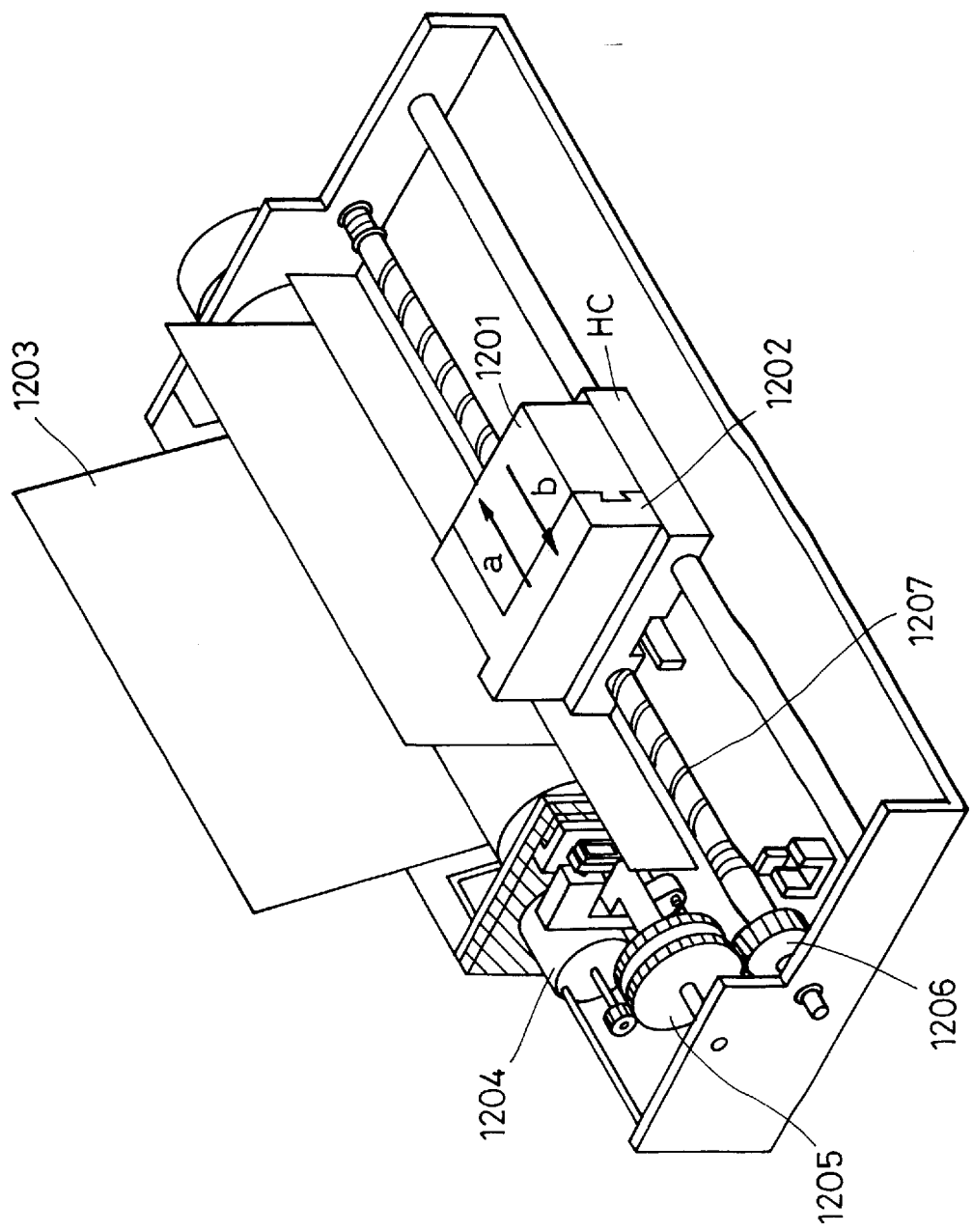
FIG. 20 is a perspective view of another example of the ink-jet recording apparatus according to the present invention.

FIG. 20 is a perspective view of an ink-jet recording apparatus using the ink-jet recording head shown in FIG. 19. In FIG. 20, a carriage HC is mounted with a head cartridge which is formed with a liquid tank unit 1201 for receiving ink and an ink-jet recording head 1202 detachably assembled with each other. The carriage HC reciprocates in the widthwise direction of a recording medium 1203 such as a recording sheet which has been transferred by a recording-medium-transfer member.

When a driving signal is supplied to the ink-jet recording head 1202 mounted on the carriage HC by a driving-signal-supply member (not shown), ink is ejected by the inkjet recording head 1202 onto the recording medium 1203 in accordance with the driving signal. The ink-jet recording apparatus according to the present embodiment includes a motor 1204 as a driving source for the recording-medium-transfer member and the carriage HC, gears 1205 and 1206 for transferring a driving power from the motor 1204, a carriage axle 1207, etc.

Recorded subjects having a superior image quality can be obtained by the ink-jet recording apparatus according to the present embodiment, which applies ink to recording media by ejecting ink by using the ink-jet recording head.

Figure 21:
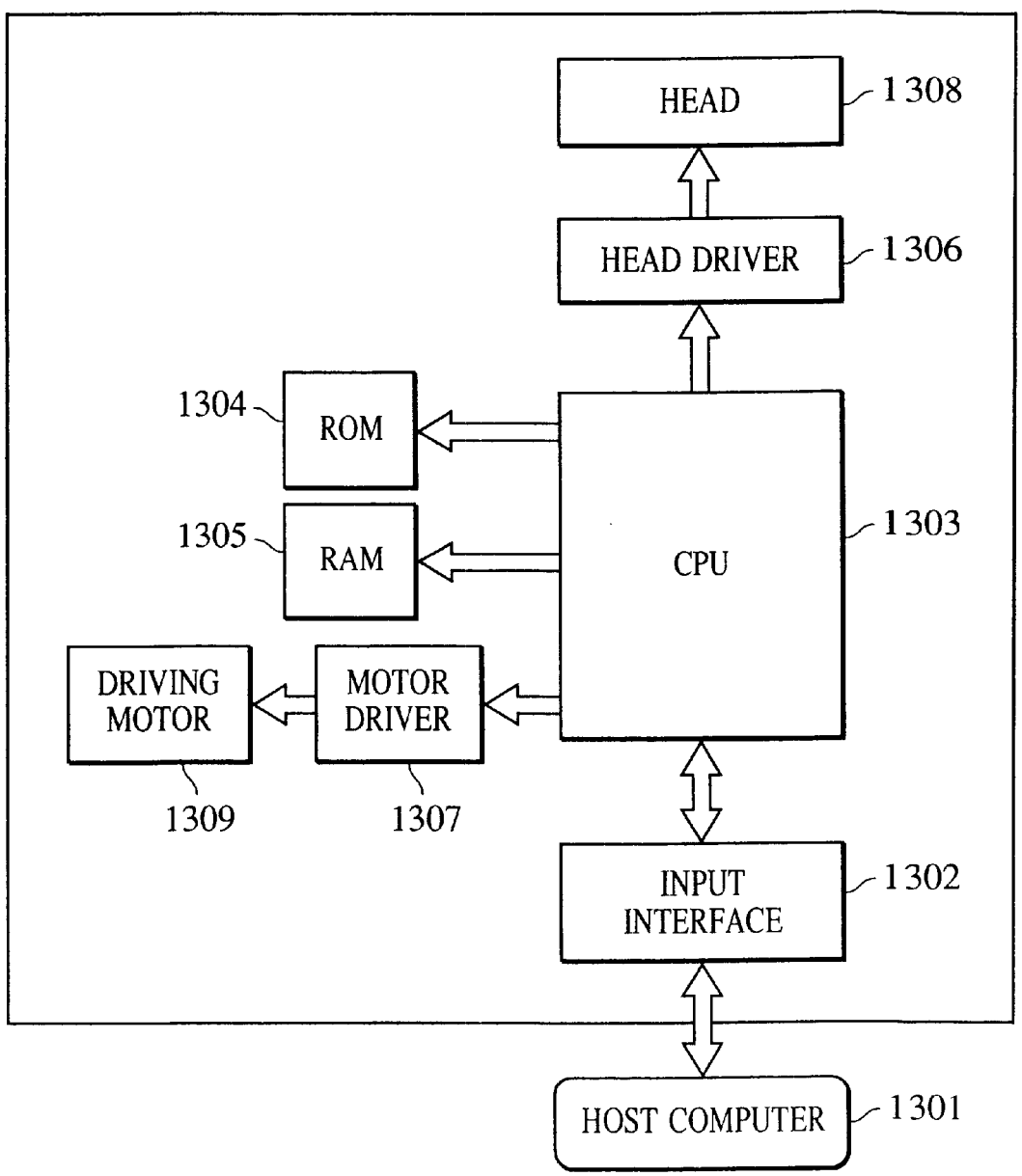
FIG. 21 is a block diagram showing the configuration for controlling the ink-jet apparatus shown in FIG. 20.
Figure 22:
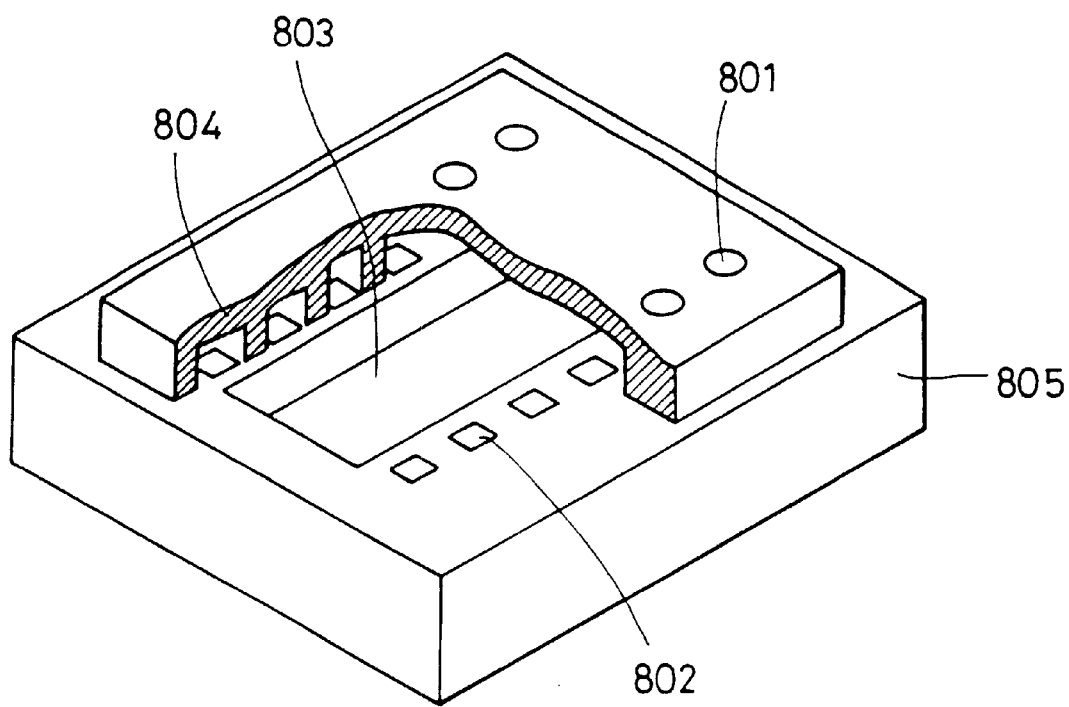
FIG. 22 is a perspective view of a circuit board of a known ink-jet recording head.

FIG. 21 is a block diagram showing the configuration for controlling the ink-jet apparatus shown in FIG. 20. The ink-jet recording apparatus receives recording data from a host computer 1301. The recording data are temporarily stored in an input interface 1302, are converted into data which can be internally processed, and are inputted to a CPU 1303 which also serves as the driving-signal-supply member. The CPU 1303 processes the data inputted thereto by using peripheral units, such as a RAM 1305, and converts into image data to be recorded in accordance with control programs stored in a ROM 1304. The CPU 1303 controls driving motors for driving the recording medium 1203 and the ink-jet recording head in synchronization with the transfer of the image data so as to record the image data on the recording medium 1203 in a proper position thereof. The image data and motor-driving data are transferred to a head 1308 and a driving motor 1309, respectively, via a head driver 1306 and a motor driver 1307, respectively. The head 1308 and the driving motor 1309 are driven at controlled timing, thereby forming an image.

The ink-jet recording apparatus according to the present embodiment can perform recording by ejecting liquid, such as ink, onto recording media, such as sheets of paper, OHP sheets, plastic materials used for compact discs and decorative plates, woven cloths, metallic material such as aluminum and copper, leather materials such as cowhides, pig hides, and artificial leathers, wooden materials such as wood and plywood, bamboo, ceramics such as tiles, and three-dimensional materials such as sponges. The ink-jet recording apparatus includes a printing apparatus for recording on sheets of paper, OHP sheets, and the like, a recording apparatus for recording on plastic materials such as compact discs and decorative plates, a recording apparatus for recording on metallic plates, a recording apparatus for recording on leathers, a recording apparatus for recording on wood, a recording apparatus for recording on ceramics, a recording apparatus for recording on three-dimensional materials such as sponges, a printing apparatus for recording on woven cloths, etc. A liquid for ejection used in the ink-jet recording apparatus may be one selected from various types of liquid, which corresponds to the recording media and the condition of recording.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A circuit board for an ink-jet recording head that ejects ink, the circuit board comprising:

a plurality of energy generating elements for generating energy used for ejecting ink; and a plurality of wiring electrodes for supplying electric power to the plurality of energy generating elements, wherein the thickness of at least two of the plurality of wiring electrodes differs according to the lengths of the at least two wiring electrodes.

2. A circuit board for an ink-jet recording head according to claim 1, wherein the resistance of the plurality of wiring electrodes is the same for each wiring electrode.

3. A circuit board for an ink-jet recording head according to one of claims 1 and 2, wherein the thickness of each of the plurality of wiring electrodes differs according to the length of each wiring electrode.

4. A circuit board for an ink-jet recording head according to one of claims 1 and 2, wherein the thickness of at least one of the plurality of wiring electrodes is greater than the thickness of other wiring electrodes which are shorter.

5. A circuit board for an ink-jet recording head according to claim 1, wherein the thickness of at least one of the plurality of wiring electrodes differs from that of the other wiring electrodes according to the number of layers forming each wiring electrode.

6. A circuit board according to claim 1, wherein said energy generating elements are electrothermal transducers, which use electric energy to generate thermal energy.

7. A circuit board for an ink-jet recording head that ejects ink, the circuit board comprising:
    a plurality of energy generating elements for generating energy used for ejecting ink; and
    a plurality of wiring electrodes for supplying electric power to the plurality of energy generating elements, each of the plurality of wiring electrodes having a plurality of layers that are successively formed by using wiring-electrode-forming patterns, the thickness of each of the plurality of wiring electrodes differing from that of the other wiring electrodes by differing each of the wiring-electrode-forming patterns from the others.

8. A circuit board according to claim 7, wherein said energy generating elements are electrothermal transducers, which use electric energy to generate thermal energy.

9. A circuit board for an ink-jet recording head that ejects ink, the circuit board comprising:
    a plurality of energy generating elements for generating energy used for ejecting ink; and
    a wiring unit for applying electric power supplied from the outside to the plurality of energy generating elements, the wiring unit being divided into a plurality of wires each formed with a plurality of layers and provided with an electrode pad for receiving the electric power,
    wherein the resistance of the plurality of wires between the electrode pads and the energy generating elements is substantially the same for each wire.

10. A circuit board for an ink-jet recording head according to claim 9, wherein the number of layers of each wire is set such that the resistance of the plurality of wires between the electrode pads and the energy generating elements is substantially the same for each wire.

11. A circuit board according to claim 9, wherein said energy generating elements are electrothermal transducers, which use electric energy to generate thermal energy.

12. An ink-jet recording head for ejecting ink comprising:
    a circuit board comprising:
        a plurality of energy generating elements for generating energy used for ejecting ink; and
        a plurality of wiring electrodes for supplying electric power to the plurality of energy generating elements,
    wherein the thickness of at least two of the plurality of wiring electrodes differs according to the lengths of the at least two wiring electrodes.

13. An ink-jet recording head according to claim 12, wherein the resistance of the plurality of wiring electrodes is the same for each wiring electrode.

14. An ink-jet recording head according to one of claims 12 and 13, wherein the thickness of each of the plurality of wiring electrodes differs according to the length of each wiring electrode.

15. An ink-jet recording head according to one of claims 12 and 13, wherein the thickness of at least one of the plurality of wiring electrodes is greater than the thickness of other wiring electrodes which are shorter.

16. An ink-jet recording head according to claim 12, wherein the thickness of at least one of the plurality of wiring electrodes differs from that of the other wiring electrodes according to the number of layers forming each wiring electrode.

17. An ink-jet recording head according to claim 12, wherein said energy generating elements are electrothermal transducers, which use electric energy to generate thermal energy.

18. An ink-jet recording head for ejecting ink comprising:
    a circuit board comprising:
        a plurality of energy generating elements for generating energy used for ejecting ink; and
        a plurality of wiring electrodes for supplying electric power to the plurality of energy generating elements, each of the plurality of wiring electrodes having a plurality of layers that are successively formed by using wiring-electrode-forming patterns, the thickness of each of the plurality of wiring electrodes differing from that of the other wiring electrodes by differing each of the wiring-electrode-forming patterns from the others.

19. An ink-jet recording head according to claim 18, wherein said energy generating elements are electrothermal transducers, which use electric energy to generate thermal energy.

20. An ink-jet recording head for ejecting ink comprising:
    a circuit board comprising:
        a plurality of energy generating elements for generating energy used for ejecting ink; and
        a wiring unit for applying electric power supplied from the outside to the plurality of energy generating elements, the wiring unit being divided into a plurality of wires each formed with a plurality of layers and provided with an electrode pad for receiving the electric power,
    wherein the resistance of the plurality of wires between the electrode pads and the energy generating elements is substantially the same for each wire.

21. An ink-jet recording head according to claim 20, wherein the number of layers of each wire is set such that the resistance of the plurality of wires between the electrode pads and the energy generating elements is substantially the same for each wire.

22. An ink-jet recording head according to claim 20, wherein said energy generating elements are electrothermal transducers, which use electric energy to generate thermal energy.

23. An ink-jet recording head cartridge comprising:
    an ink-jet recording head for ejecting ink comprising:
        a circuit board comprising:
            a plurality of energy generating elements for generating energy used for ejecting ink; and
            a plurality of wiring electrodes for supplying electric power to the plurality of energy generating elements; and
    an ink tank for receiving the ink to be supplied to the ink-jet recording head,
    wherein the thickness of at least two of the plurality of wiring electrodes differs according to the lengths of the at least two wiring electrodes.

24. An ink-jet recording head cartridge according to claim 23, wherein the resistance of the plurality of wiring electrodes is the same for each wiring electrode.

25. An ink-jet recording head cartridge according to one of claims 23 and 24, wherein the thickness of each of the plurality of wiring electrodes differs according to the length of each wiring electrode.

26. An ink-jet recording head cartridge according to one of claims 23 and 24, wherein the thickness of at least one of the plurality of wiring electrodes is greater than the thickness of other wiring electrodes which are shorter.

27. An ink-jet recording head cartridge according to claim 23, wherein the thickness of at least one of the plurality of wiring electrodes differs from that of the other wiring electrodes according to the number of layers forming each wiring electrode.

28. An ink-jet recording head cartridge according to claim 23, wherein said energy generating elements are electrothermal transducers, which use electric energy to generate thermal energy.

29. An ink-jet recording head cartridge comprising:
   an ink-jet recording head for ejecting ink comprising:
      a circuit board comprising:
         a plurality of energy generating elements for generating energy used for ejecting ink; and
         a plurality of wiring electrodes for supplying electric power to the plurality of energy generating elements, each of the plurality of wiring electrodes having a plurality of layers that are successively formed by using wiring-electrode-forming patterns, the thickness of each of the plurality of wiring electrodes differing from that of the other wiring electrodes by differing each of the wiring-electrode-forming patterns from the others; and
   an ink tank for receiving the ink to be supplied to the ink-jet recording head.

30. An ink-jet recording head cartridge according to claim 29, wherein said energy generating elements are electrothermal transducers, which use electric energy to generate thermal energy.

31. An ink-jet recording head cartridge comprising:
   an ink-jet recording head for ejecting ink comprising:
      a circuit board comprising:
         a plurality of energy generating elements for generating energy used for ejecting ink; and
         a wiring unit for applying electric power supplied from the outside to the plurality of energy generating elements, the wiring unit being divided into a plurality of wires each formed with a plurality of layers and provided with an electrode pad for receiving the electric power; and
   an ink tank for receiving the ink to be supplied to the ink-jet recording head,
   wherein the resistance of the plurality of wires between the electrode pads and the energy generating elements is substantially the same for each wire.

32. An ink-jet recording head cartridge according to claim 31, wherein the number of layers of each wire is set such that the resistance of the plurality of wires between the electrode pads and the energy generating elements is substantially the same for each wire.

33. An ink-jet recording head cartridge according to claim 31, wherein said energy generating elements are electrothermal transducers, which use electric energy to generate thermal energy.

34. An ink-jet recording apparatus comprising:
   an ink-jet recording head for ejecting ink comprising:
      a circuit board comprising:
         a plurality of energy generating elements for generating energy used for ejecting ink; and
         a plurality of wiring electrodes for supplying electric power to the plurality of energy generating elements,
   wherein the thickness of at least two of the plurality of wiring electrodes differs according to the lengths of the at least two wiring electrodes.

35. An ink-jet recording apparatus according to claim 34, wherein the resistance of the plurality of wiring electrodes is the same for each wiring electrode.

36. An ink-jet recording apparatus according to one of claims 34 and 35, wherein the thickness of each of the plurality of wiring electrodes differs according to the length of each wiring electrode.

37. An ink-jet recording apparatus according to one of claims 34 and 35, wherein the thickness of at least one of the plurality of wiring electrodes is greater than the thickness of other wiring electrodes which are shorter.

38. An ink-jet recording apparatus according to claim 34, wherein the thickness of at least one of the plurality of wiring electrodes differs from that of the other wiring electrodes according to the number of layers forming each wiring electrode.

39. An ink-jet recording apparatus according to claim 34, wherein said energy generating elements are electrothermal transducers, which use electric energy to generate thermal energy.

40. An ink-jet recording apparatus comprising:
   an ink-jet recording head for ejecting ink comprising:
      a circuit board comprising:
         a plurality of energy generating elements for generating energy used for ejecting ink; and
         a plurality of wiring electrodes for supplying electric power to the plurality of energy generating elements, each of the plurality of wiring electrodes having a plurality of layers that are successively formed by using wiring-electrode-forming patterns, the thickness of each of the plurality of wiring electrodes differing from that of the other wiring electrodes by differing each of the wiring-electrode-forming patterns from the others.

41. An ink-jet recording apparatus according to claim 40, wherein said energy generating elements are electrothermal transducers, which use electric energy to generate thermal energy.

42. An ink-jet recording apparatus comprising:
   an ink-jet recording head for ejecting ink comprising:
      a circuit board comprising:
         a plurality of energy generating elements for generating energy used for ejecting ink; and
         a wiring unit for applying electric power supplied from the outside to the plurality of energy generating elements, the wiring unit being divided into a plurality of wires each formed with a plurality of layers and provided with an electrode pad for receiving the electric power,
   wherein the resistance of the plurality of wires between the electrode pads and the energy generating elements is substantially the same for each wire.

43. An ink-jet recording apparatus according to claim 42, wherein the number of layers of each wire is set such that the resistance of the plurality of wires between the electrode pads and the energy generating elements is substantially the same for each wire.

44. An ink-jet recording apparatus according to claim 42, wherein said energy generating elements are electrothermal transducers, which use electric energy to generate thermal energy.

* * * * *